United States Patent
Kwon et al.

(10) Patent No.: US 10,403,606 B2
(45) Date of Patent: Sep. 3, 2019

(54) METHOD OF FABRICATING A SEMICONDUCTOR PACKAGE

(71) Applicant: Samsung Electronics Co., Ltd., Suwon-si, Gyeonggi-do (KR)

(72) Inventors: Heung-Kyu Kwon, Seongnam-si (KR); Min-Ok Na, Bucheon-si (KR); Sung-Woo Park, Anyang-si (KR); Ji-Hyun Park, Suwon-si (KR); Su-Min Park, Ansan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/971,600

(22) Filed: May 4, 2018

(65) Prior Publication Data

US 2018/0331071 A1 Nov. 15, 2018

Related U.S. Application Data

(60) Continuation of application No. 15/241,452, filed on Aug. 19, 2016, now Pat. No. 9,978,721, which is a
(Continued)

(30) Foreign Application Priority Data

Dec. 17, 2009 (KR) .................. 10-2009-0126345
Jun. 4, 2010 (KR) .................. 10-2010-0052827

(51) Int. Cl.
*H01L 25/00* (2006.01)
*H01L 25/065* (2006.01)
(Continued)

(52) U.S. Cl.
CPC ........ *H01L 25/0657* (2013.01); *H01L 21/561* (2013.01); *H01L 21/565* (2013.01);
(Continued)

(58) Field of Classification Search
CPC .............. H05K 1/14; H05K 1/141–144; H01L 2924/01078–01079
(Continued)

(56) References Cited

U.S. PATENT DOCUMENTS 6,489,676 B2 12/2002 Taniguchi et al.
6,812,066 B2 11/2004 Taniguchi et al.
(Continued)

FOREIGN PATENT DOCUMENTS

CN 101150078 A 3/2008
CN 101211511 A 7/2008
(Continued)

OTHER PUBLICATIONS

Chinese Office Action dated Sep. 5, 2014 for Chinese Patent Application No. 201010594275.4 (with English Translation).
(Continued)

*Primary Examiner* — Tuan T Dinh
(74) *Attorney, Agent, or Firm* — Harness, Dickey & Pierce, P.L.C.

(57) ABSTRACT

A method for fabricating a semiconductor package including mounting a first semiconductor chip on a first substrate, disposing a first connector on the first substrate, placing a molding control film on the first semiconductor chip to horizontally extend over the first substrate, filling a space between the molding control film and the first substrate with a molding compound such that the molding compound contacts side surfaces of the first semiconductor chip and covers the first connector and does not cover a top surface of the first semiconductor chip, detaching the molding control film, forming an opening through the molding compound to expose a portion of the first connector, disposing a second connector and a second semiconductor chip on opposite surfaces of a second substrate, respectively, and
(Continued)

placing the second substrate on the first substrate such that the second connector contacts the first connector may be provided.

17 Claims, 29 Drawing Sheets

Related U.S. Application Data continuation of application No. 14/693,352, filed on Apr. 22, 2015, now abandoned, which is a continuation of application No. 13/934,942, filed on Jul. 3, 2013, now Pat. No. 9,042,115, which is a division of application No. 12/910,415, filed on Oct. 22, 2010, now Pat. No. 8,508,954.

(51) Int. Cl.

| | | |
|---|---|---|
| *H01L 21/56* | (2006.01) | |
| *H01L 23/31* | (2006.01) | |
| *H01L 23/498* | (2006.01) | |
| *H01L 23/552* | (2006.01) | |
| *H01L 23/00* | (2006.01) | |
| *H01L 25/10* | (2006.01) | |
| *H01L 25/18* | (2006.01) | |
| *H01L 23/48* | (2006.01) | |

(52) U.S. Cl.
CPC ........ *H01L 21/566* (2013.01); *H01L 23/3128* (2013.01); *H01L 23/3142* (2013.01); *H01L 23/49811* (2013.01); *H01L 23/49816* (2013.01); *H01L 23/49827* (2013.01); *H01L 23/552* (2013.01); *H01L 24/13* (2013.01); *H01L 24/16* (2013.01); *H01L 24/17* (2013.01); *H01L 24/48* (2013.01); *H01L 24/49* (2013.01); *H01L 24/73* (2013.01); *H01L 24/97* (2013.01); *H01L 25/105* (2013.01); *H01L 25/18* (2013.01); *H01L 25/50* (2013.01); *H01L 21/568* (2013.01); *H01L 23/481* (2013.01); *H01L 23/49838* (2013.01); *H01L 2224/0401* (2013.01); *H01L 2224/0557* (2013.01); *H01L 2224/05552* (2013.01); *H01L 2224/13099* (2013.01); *H01L 2224/14181* (2013.01); *H01L 2224/16112* (2013.01); *H01L 2224/16145* (2013.01); *H01L 2224/16225* (2013.01); *H01L 2224/1703* (2013.01); *H01L 2224/17051* (2013.01); *H01L 2224/17181* (2013.01); *H01L 2224/48091* (2013.01); *H01L 2224/48145* (2013.01); *H01L 2224/48225* (2013.01); *H01L 2224/48227* (2013.01); *H01L 2224/49* (2013.01); *H01L 2224/73257* (2013.01); *H01L 2224/73265* (2013.01); *H01L 2224/81192* (2013.01); *H01L 2224/85* (2013.01); *H01L 2224/97* (2013.01); *H01L 2225/06506* (2013.01); *H01L 2225/06513* (2013.01); *H01L 2225/06541* (2013.01); *H01L 2225/1023* (2013.01); *H01L 2225/1058* (2013.01); *H01L 2924/0002* (2013.01); *H01L 2924/00014* (2013.01); *H01L 2924/014* (2013.01); *H01L 2924/01006* (2013.01); *H01L 2924/01029* (2013.01); *H01L 2924/01032* (2013.01); *H01L 2924/01033* (2013.01); *H01L 2924/01064* (2013.01); *H01L 2924/01077* (2013.01); *H01L 2924/01078* (2013.01); *H01L 2924/07802* (2013.01); *H01L 2924/12042* (2013.01); *H01L 2924/14* (2013.01); *H01L 2924/15311* (2013.01); *H01L 2924/15331* (2013.01); *H01L 2924/15787* (2013.01); *H01L 2924/181* (2013.01); *H01L 2924/1815* (2013.01); *H01L 2924/18161* (2013.01); *H01L 2924/3025* (2013.01); *H01L 2924/3511* (2013.01)

(58) Field of Classification Search
USPC ......... 361/760–774, 790, 795, 803; 257/686, 257/728–730, 787–790
See application file for complete search history.

(56) References Cited

U.S. PATENT DOCUMENTS

| | | | |
|---|---|---|---|
| 6,815,254 B2 | 11/2004 | Mistry et al. | |
| 7,122,404 B2 | 10/2006 | Bolken et al. | |
| 7,185,426 B1 | 3/2007 | Hiner et al. | |
| 7,245,008 B2 | 7/2007 | Lee | |
| 7,247,517 B2 | 7/2007 | Rumer et al. | |
| 7,262,080 B2 | 8/2007 | Go et al. | |
| 7,262,082 B1 | 8/2007 | Lin et al. | |
| 7,279,795 B2 | 10/2007 | Periaman et al. | |
| 7,345,361 B2 | 3/2008 | Mallik et al. | |
| 7,372,151 B1 | 5/2008 | Fan et al. | |
| 7,446,419 B1 | 11/2008 | Lin et al. | |
| 8,796,846 B2 | 8/2014 | Lin et al. | |
| 2002/0135057 A1 | 9/2002 | Kurita | |
| 2003/0025184 A1 | 2/2003 | Morozumi | |
| 2005/0023662 A1 | 2/2005 | Bolken et al. | |
| 2007/0145556 A1 | 6/2007 | Bolken et al. | |
| 2007/0164457 A1 | 7/2007 | Yamaguchi et al. | |
| 2007/0290376 A1 | 12/2007 | Zhao et al. | |
| 2008/0017968 A1 | 1/2008 | Choi et al. | |
| 2008/0073769 A1 | 3/2008 | Wu et al. | |
| 2008/0088001 A1 | 4/2008 | Kim et al. | |
| 2008/0150765 A1 | 6/2008 | Nakajima | |
| 2008/0157328 A1 | 7/2008 | Kawata | |
| 2008/0230887 A1 | 9/2008 | Sun et al. | |
| 2008/0258289 A1 | 10/2008 | Pendse et al. | |
| 2010/0171205 A1 | 7/2010 | Chen et al. | |
| 2011/0227209 A1* | 9/2011 | Yoon ................... | H01L 23/3128 257/686 |
| 2013/0256914 A1* | 10/2013 | Cheng ................. | H01L 23/3114 257/777 |
| 2014/0264856 A1* | 9/2014 | Huang .................. | H01L 25/074 257/738 |

FOREIGN PATENT DOCUMENTS

| | | |
|---|---|---|
| JP | 2002-368027 A | 12/2002 |
| JP | 2007-194436 A | 8/2007 |
| JP | 2008-166373 A | 7/2008 |
| KR | 10-0692441 A | 6/2002 |
| KR | 10-0493063 B1 | 1/2005 |
| KR | 100770934 B1 | 10/2007 |
| KR | 10-2007-0120918 A | 12/2007 |
| KR | 100842915 B1 | 6/2008 |

OTHER PUBLICATIONS

Chinese Office Action dated Apr. 8, 2014 for Chinese Application No. 201010594275.4 (full translation provided).
Chinese Office Action dated Apr. 8, 2014 for corresponding Chinese Application No. 201010594275.4 (full translation provided).
Chinese Office Action dated Sep. 5, 2014 for Corresponding Chinese Patent Application No. 201010594275.4 with English Translation.

\* cited by examiner

METHOD OF FABRICATING A SEMICONDUCTOR PACKAGE

CROSS-REFERENCE TO RELATED APPLICATIONS

This application is a Continuation Application of U.S. application Ser. No. 15/241,452, filed Aug. 19, 2016, now allowed, which is a Continuation Application of U.S. application Ser. No. 14/693,352, filed Apr. 22, 2015, which is a Continuation Application of U.S. application Ser. No. 13/934,942, filed Jul. 3, 2013, now U.S. Pat. No. 9,042,115 issued May 26, 2015, which is a divisional application of U.S. application Ser. No. 12/910,415, filed Oct. 22, 2010, now U.S. Pat. No. 8,508,954 issued Aug. 13, 2013, which claims priority to Korean Patent Applications No. 10-2009-0126345 filed on Dec. 17, 2009 and No. 10-2010-0052827 filed on Jun. 4, 2010, the entire disclosures of each of which are incorporated herein by reference.

BACKGROUND

1. Technical Field

The present disclosure relates to stacked semiconductor packages, and more particularly to stacked semiconductor packages and methods of fabricating the same.

2. Description of Related Art

Package on Package (PoP) is an integrated circuit packaging technique to allow vertically combining discrete logic and memory ball grid array (BGA) packages. Two or more packages are stacked with an interface to route signals between them. This allows higher density, for example in the mobile telephone/PDA market. In the PoP, two or more memory packages can be stacked on top of each other. Alternatively, a memory package can be stacked on a logic package. Using the PoP technique, space in the motherboard can be saved.

SUMMARY

Example embodiments relate to stacked semiconductor chip packages, methods of the fabrication the same and/or systems employing the same.

According to an exemplary embodiment, an apparatus comprises a first substrate comprising a first land and a second substrate comprising a second land, a first molding compound disposed between the first substrate and the second substrate, a first semiconductor chip disposed on the first substrate and in contact with the first molding portion, and a first connector contacting the first land and a second connector contacting the second land, the second connector disposed on the first connector, wherein a volume of the second connector is greater than a volume of the first connector, a surface of the first semiconductor chip is exposed, and the first molding compound is in contact with the second connector, and at least a portion of the second connector is surrounded by the first molding compound.

The first connector can be disposed in the first molding compound.

A portion of the second connector may not be disposed in the first molding compound.

The apparatus may further comprise a second semiconductor chip disposed on the second substrate.

The apparatus may further comprise a second molding compound in contact with the second semiconductor chip.

The first and second substrates may comprise a PCB or a ceramic substrate.

The first and second connectors can be configured to transmit power or signals.

The first semiconductor chip may comprise a logic device, and the second semiconductor chip comprises a memory device.

The first connector and the second connector can be solder balls.

The first semiconductor chip may comprise a plurality of vertical TSVs therein.

The apparatus may further comprise a third connector disposed between the first connector and the second connector.

According to an exemplary embodiment, an electronic system comprises a control unit, an input unit configured to transmit an electrical signal to the control unit, an output unit configured to receive the electrical signal from the control unit and to output a processing result of the electronic system, a storage unit configured to store data to be processed or already processed by the control unit, and a communication unit configured to receive the electrical signal from the control unit and to transmit or to receive the electrical signal to or from another electronic system, wherein at least one of the control unit, the input unit, the output unit, the storage unit, and the communication unit includes the apparatus comprising a first substrate comprising a first land and a second substrate comprising a second land, a first molding compound disposed between the first substrate and the second substrate, a first semiconductor chip disposed on the first substrate and in contact with the first molding portion, and a first connector contacting the first land and a second connector contacting the second land, the second connector disposed on the first connector, wherein a volume of the second connector is greater than a volume of the first connector, a surface of the first semiconductor chip is exposed, and the first molding compound is in contact with the second connector, and at least a portion of the second connector is surrounded by the first molding compound.

The control unit may comprise at least one of a central processing unit (CPU), a main control unit (MCU), a semiconductor module.

The input unit may comprise at least one of a keyboard, a keypad, a mouse, a touch pad, or an image recognizer.

The output unit may comprise at least one of a monitor, a printer, or a beam emitter.

The storage unit may comprise at least one of a semiconductor memory device, a magnetic storage device, and optical storage device, or a server having a data storage function.

The communication unit may comprise at least one of a wired transceiving device, a wireless transceiving device, or an infrared (IR) port.

The electronic system can be at least one of a computer, a network server, a networking printer, a scanner, a wireless controller, a mobile communication terminal, a switching system, or any electronic device capable of programmed operations.

According to an exemplary embodiment, a method may comprise disposing a first semiconductor chip on a first substrate, disposing a first connector on a land of the first substrate, placing a first molding compound on the first substrate and in contact with the first semiconductor chip and the first connector, exposing a surface of the first substrate, and forming an opening through the first molding compound to expose a portion of the first connector.

The method may further comprise disposing a second connector and a second semiconductor chip on a second substrate, and coupling the first connector to the second connector.

The second connector can have a larger volume than the first connector.

The method may further comprise placing a second molding compound in contact with the second semiconductor chip and the second connector.

The method may further comprise dipping the second connector into solder flux.

The first and second connectors can be solder balls.

The second connector can have a larger radius than the first connector.

According to an exemplary embodiment, a method comprises disposing a first semiconductor chip and a first solder ball on a first substrate, placing a molding compound on the first substrate and in contact with the first semiconductor chip and the first solder ball, forming an opening through the molding compound to expose a portion of the first connector, disposing a second semiconductor chip and a second solder ball on a second substrate, and coupling the first solder ball to the second solder ball, wherein a radius of the first solder ball is greater than a radius of the second solder ball.

The method may further comprise exposing a surface of the first substrate.

The second solder ball can have a larger volume than the first solder ball.

The method may further comprise placing a second molding compound in contact with the second semiconductor chip and the second solder ball.

The method may further comprise dipping the second solder ball into solder flux.

BRIEF DESCRIPTION OF THE DRAWINGS

Exemplary embodiments of the present invention can be understood in more detail from the following descriptions taken in conjunction with the accompanying drawings, in which.

DETAILED DESCRIPTION OF THE EMBODIMENTS

Example embodiments of inventive concepts will be described with reference to accompanying drawings.

Although a few example embodiments of inventive concepts are shown and described, it would be appreciated by those of ordinary skill in the art that changes may be made in these example embodiments without departing from the principles and spirit of example embodiments, the scope of which is defined in the claims and their equivalents.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Example embodiments of inventive concepts are described herein with reference to cross-section illustrations that are schematic illustrations of example embodiments (and intermediate structures) of inventive concepts. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Figure 1A:
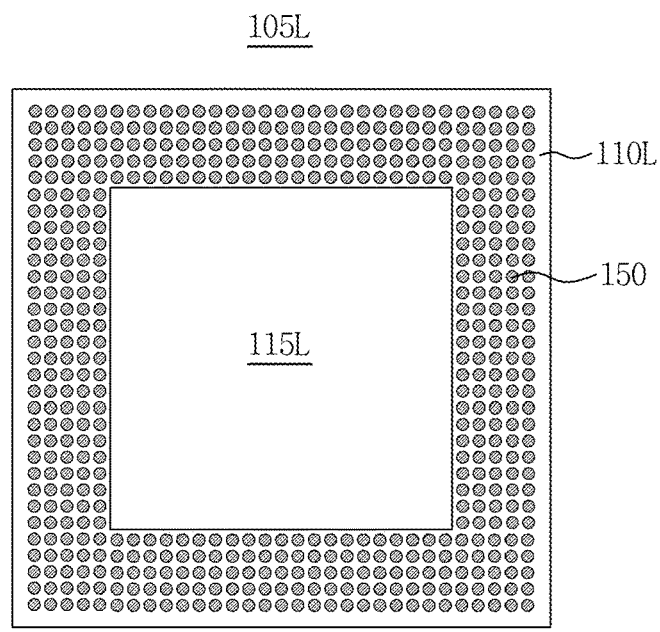
FIG. 1A is a schematic plan view of a lower semiconductor package according to an embodiment of the inventive concepts.
Figure 1B:
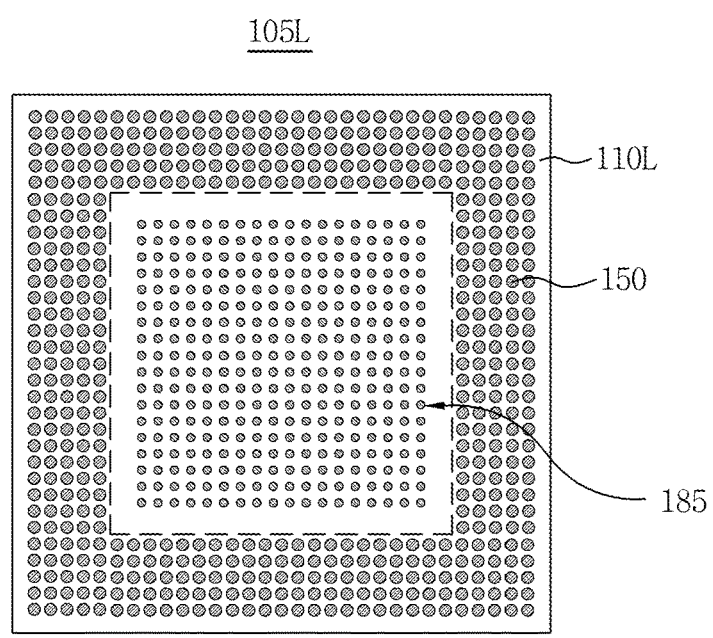
FIG. 1B is a schematic plan view of a lower semiconductor package according to an embodiment of the inventive concepts.

FIG. 1A is a schematic plan view of a lower semiconductor package according to an embodiment of the inventive concepts. In FIG. 1A, a lower semiconductor chip is disclosed. FIG. 1B is a schematic plan view of a lower semiconductor package according to an exemplary embodiment. In FIG. 1B, a lower semiconductor chip is not disclosed.

Referring to FIG. 1A, a lower semiconductor package 105L may include a lower package substrate 110L, a lower semiconductor chip 115L disposed on the lower package substrate 110L, and a plurality of inter-package connectors 150 disposed around the lower semiconductor chip 115L. Referring to FIG. 1B, the dotted lines indicate a location configured to receive the lower semiconductor chip 115L. According to an embodiment, the lower semiconductor package 105L may include a plurality of flip chip landing pads 185 disposed between the lower package substrate 110L and the lower semiconductor chip 115L. The flip chip landing pads 185 can be surrounded by the plurality of inter-package connectors 150. The flip chip landing pads 185 may be electrically connected to other elements such as, for example, through silicon vias (TSVs), through silicon via plugs and/or conductive chip bumps.

FIGS. 2A through 2H are schematic longitudinal sectional views of an apparatus according to embodiments of the inventive concepts.

Figure 2A:
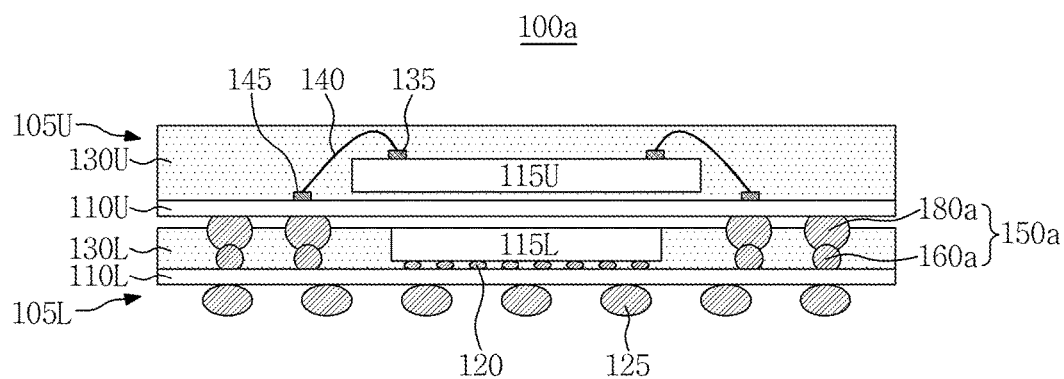
FIGS. 2A through 2H are schematic longitudinal sectional views of an apparatus according to embodiments of the inventive concepts.

Referring to FIG. 2A, an apparatus 100a includes a lower semiconductor package 105L, an upper semiconductor package 105U, and inter-package connectors 150a configured to electrically connect the lower and upper semiconductor packages 105L and 105U. The upper semiconductor package 105U is stacked on the lower semiconductor package 105L. A portion of the inter-package connectors 150a may be a part of the lower semiconductor package 105L. Another portion of the inter-package connectors 150a may be a part of the upper semiconductor package 105U.

The lower semiconductor package 105L may include a lower package substrate 110L, a lower semiconductor chip 115L disposed on a top surface of the lower package substrate 110L, a lower molding compound 130L, and conductive solder balls 125 disposed on a bottom surface of the lower package substrate 110L. The lower semiconductor package 105L may be formed using, for example, a flip-chip technique. The lower package substrate 110L may comprise, for example, a printed circuit board (PCB) or a ceramic substrate.

The lower semiconductor chip 115L may comprise a logic device, such as a microprocessor. The lower semiconductor chip 115L may be disposed on one surface of the lower package substrate 110L. The lower semiconductor chip 115L may be electrically connected to the solder balls 125 through conductive chip bumps 120. The conductive chip bumps 120 may be disposed on the top surface of the lower semiconductor substrate 110L. That is, the lower semiconductor chip 115L may include a flip-chip connection structure having a grid array according to an embodiment of the inventive concepts.

The conductive chip bumps 120 may be interposed between the lower package substrate 110L and the lower semiconductor chip 115L. The conductive chip bumps 120 may electrically connect the lower package substrate 110L and the lower semiconductor chip 115L. The conductive chip bumps 120 may include a solder material. Thus, the conductive chip bumps 120 may be formed using, for example, a soldering process.

The conductive solder balls 125 are configured to electrically connect the apparatus 100a to a module board or a main circuit board.

The lower molding compound 130L covers the conductive chip bumps 120. An adhesive may be formed around the conductive chip bumps 120. For example, the adhesive can be disposed between the lower semiconductor chip 115L and the lower package substrate 110L. The lower molding compound 130L surrounds a lateral surface of the lower semiconductor chip 115L. For example, the lower semiconductor chip 115L may be adhered to the top surface of the lower semiconductor package 105L using the adhesive, and the lower molding compound 130L may surround the lateral surface of the lower semiconductor chip 115L.

In an embodiment, the adhesive may be included in the lower molding compound 130L. In an embodiment, the lower molding compound 130L may surround lateral surfaces of the inter-package connectors 150a. In an embodiment, a top surface of the lower semiconductor chip 115L may not be covered with the lower molding compound 130L. In other words, the top surface of the lower semiconductor chip 115L is exposed. In an embodiment, a top surface of the lower molding compound 130L is coplanar with the top surface of the lower semiconductor chip 115L. In an embodiment, since a thickness of the lower semiconductor package 105L is reduced, a thickness of the apparatus 100a is also reduced. Since the top of the lower semiconductor chip 115L is exposed, heat can be dissipated without being interrupted by the epoxy molding compound (EMC). As such, heat radiation property can be improved. Since the lower semiconductor package 105L has a better tolerance or resistance against a high-temperature process as compared to the one covered by the EMC, the lower semiconductor package 105L may have a better tolerance or resistance against warpage or distortion so that the flatness of the lower semiconductor package 105L and the lower semiconductor chip 115L can be improved.

Since physical pressure may be directly applied to top surface of the lower semiconductor chip 115L without passing through a molding material, a grid array technique or a multilayered molding technique can be stably performed. When the thickness of the lower molding compound 130L is reduced, the entire height of the inter-package connectors 150a may be reduced. Since the inter-package connectors 150a are formed using a soldering process (e.g., a reflow process), when the entire height of the inter-package connectors 150a is reduced, the maximum horizontal width of the inter-package connectors 150a may be reduced. This is because structures formed using the soldering process may be substantially spherical. When the maximum horizontal width of the inter-package connectors 150a is reduced, a volume of the inter-package connectors 150a may be reduced. As such, an interval or pitch between the inter-package connectors 150a may be reduced. Thus, when the thickness of the lower molding compound 130L is reduced, more numbers of the inter-package connectors 150a may be formed in a given area. According to an embodiment of the inventive concepts, the apparatus 100a having finer and more equally distanced inter-package connectors 150a may be formed.

The upper semiconductor package 105U may include an upper package substrate 110U and an upper semiconductor chip 115U. The upper package substrate 110U may comprise, for example, a PCB or a ceramic substrate.

The upper semiconductor chip 115U may comprise a memory device, such as a dynamic random access memory (DRAM) device or a flash memory device. The upper semiconductor chip 115U may have a greater horizontal width than the lower semiconductor chip 115L. When the upper semiconductor chip 115U is wider than the lower semiconductor chip 115L in a horizontal direction, since an area occupied by the inter-package connectors 150a may be increased, the stack structure 100a of the semiconductor packages may be formed to a smaller size. When the area occupied by the inter-package connectors 150a is increased, a larger number of the inter-package connectors 150a may be formed. Alternatively, when a same number of the inter-package connectors 150a is formed, the stack structure 100a of the semiconductor packages may be reduced.

The upper semiconductor chip 115U may be disposed on a top surface of the upper package substrate 110U. The upper semiconductor chip 115U may be electrically connected to the upper package substrate 110U through bonding pads 135, bonding wires 140, and wire pads 145.

The bonding pads 135 may be formed on a top surface of the upper semiconductor chip 115U. The wire pads 145 may be formed on the top surface of the upper package substrate 110U. The bonding wires 140 may electrically connect the bonding pads 135 with the wire pads 145, respectively.

The upper semiconductor chip 115U may be covered with an upper molding compound 130U.

The inter-package connectors 150a may physically or electrically connect the lower semiconductor package 105L with the upper semiconductor package 105U. The inter-package connectors 150a may include lower connectors 160a and upper connectors 180a, respectively. The lower and upper connectors 160a and 180a may include a solder material.

Figure 2B:
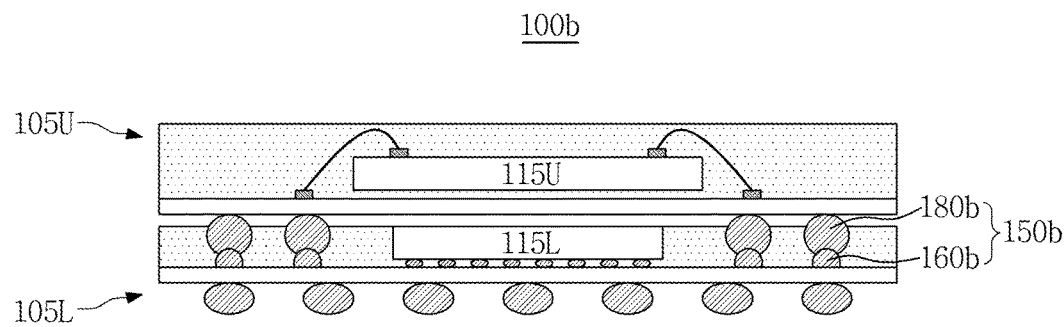

The upper semiconductor chip 115U may have a larger horizontal width than the lower semiconductor chip 115L. According to an embodiment of the inventive concepts, the inter-package connectors 150a may be formed above or on a top surface of the lower package substrate 110L where the lower semiconductor chip 115L is formed. The inter-package connectors 150a may be formed below or on a bottom surface of the upper package substrate 110U where the upper semiconductor chip 115U is not formed. Thus, the inter-package connectors 150a may be affected by the size of the lower semiconductor chip 115L. An area standard of the stack structure 100a of the semiconductor packages may be determined based on semiconductor standard rules such as the Joint Electron Device Engineering Council (JEDEC) rules. Thus, when the lower semiconductor chip 115L is greater in size than the upper semiconductor chip 115U, restrictions of a space, where the inter-package connectors 150a may be formed, may be increased with reduced efficiency. According to an embodiment of the inventive concepts, when the upper semiconductor chip 115U is greater in size than the lower semiconductor chip 115L, spatial restrictions may be reduced, and efficiency may be improved. Therefore, according to an embodiment of the inventive concepts, the upper semiconductor chip 115U may be formed to be greater in size than the lower semiconductor chip 115L. Referring to FIG. 2B, an apparatus 100b may include a lower semiconductor package 105L, an upper semiconductor package 105U, and inter-package connectors 150b configured to electrically connect the lower and upper semiconductor packages 105L and 105U. The inter-package connectors 150b may include lower connectors 160b and upper connectors 180b. The lower and upper connectors 160b and 180b may comprise a solder material. The lower connectors 160b may have a hemispherical shape.

Figure 2C:
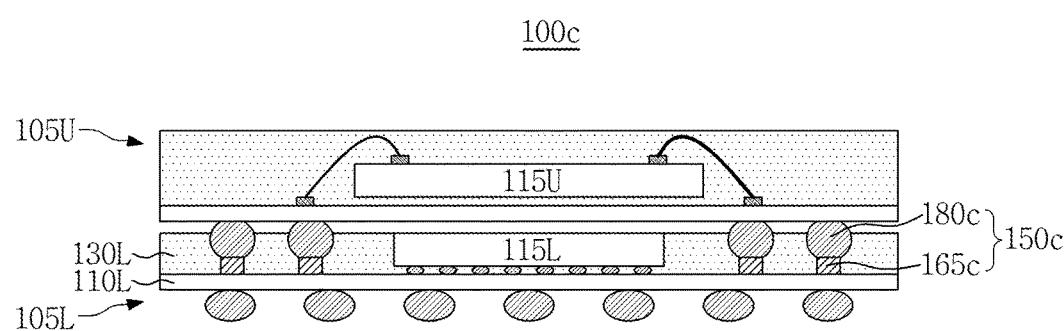

Referring to FIG. 2C, an apparatus 100c may include a lower semiconductor package 105L, an upper semiconductor package 105U, and inter-package connectors 150c configured to electrically connect the lower and upper semiconductor packages 105L and 105U. The upper semiconductor package 105U is stacked on the lower semiconductor package 105L. The inter-package connectors 150c may include bottom connectors 165c and upper connectors 180c. Each of the bottom connectors 165c may be formed as a mesa or pillar shape. For example, each of the bottom connectors 165c may be formed as a circular, cylindrical or polygonal pillar shape.

The bottom connectors 165c may be attached to a top surface of the lower package substrate 110L. For example, the bottom connectors 165c may comprise metal. The bottom connectors 165c may be formed using, for example, a casting process, a deposition process, a bonding process, or a plating process.

A metallic barrier layer may be formed on the surfaces of the bottom connectors 165c. For example, main bodies of the bottom connectors 165c may comprise copper (Cu), and a nickel (Ni) barrier layer may be formed on the surfaces of the bottom connectors 165c.

Although it is illustrated that the upper connectors 180c are greater in size than the bottom connectors 165c, the present inventive concepts is not limited thereto.

The processes of forming the bottom connectors 165c as a mesa shape on the top surface of the lower package substrate 110L may be less affected by a distance between the bottom connectors 165c than a soldering process. Thus, the bottom connectors 165c may be formed in various shapes. For instance, each of the bottom connectors 165c may have a smaller horizontal size and a greater vertical size than the one shown in FIG. 2C. In this case, only small portions of the upper connectors 180c may be formed below the surface of the lower molding compound 130L. In other words, the center of the upper connector 180c may be formed above a top surface of the lower molding compound 130L. Although it is illustrated that each of the upper connectors 180c has an almost circular sectional shape, the inventive concepts is not limited thereto. For example, each of the upper connectors 180c may have an elliptical sectional shape. The upper connectors 180c may include a solder material.

Figure 2D:
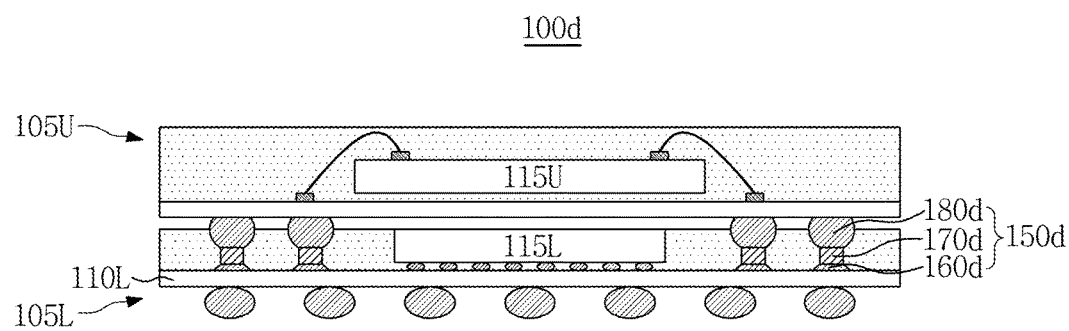

Referring to FIG. 2D, an apparatus 100d may include a lower semiconductor package 105L, an upper semiconductor package 105U, and inter-package connectors 150d configured to electrically connect the lower and upper semiconductor packages 105L and 105U. The upper semiconductor package 105U is stacked on the lower semiconductor package 105L. The inter-package connectors 150d may include lower connectors 160d, intermediate connectors 170d, and upper connectors 180d. Each of the lower connectors 160d may have a spherical shape or a hemispherical shape. An imaginary center of each of the lower connectors 160d may be formed above or below the top surface of the lower package substrate 110L. The intermediate connectors 170d may have a mesa shape and attached to top surfaces of the lower connectors 160d. The intermediate connectors 170d may comprise copper (Cu). A metallic barrier layer, for example, a nickel (Ni) barrier layer, may be formed on the surfaces of the intermediate connectors 170d. The lower and upper connectors 160d and 180d may comprise a solder material.

Figure 2E:
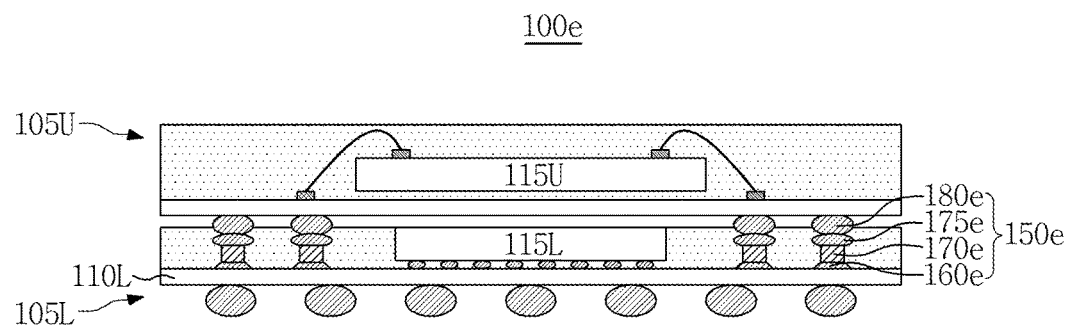

Referring to FIG. 2E, an apparatus 100e may include a lower semiconductor package 105L, an upper semiconductor package 105U, and inter-package connectors 150e configured to electrically connect the lower and upper semiconductor packages 105L and 105U. The upper semiconductor package 105U is stacked on the lower semiconductor package 105L. The inter-package connectors 150e may include lower connectors 160e, intermediate connectors 170e, intermediate adhesion parts 175e, and upper connectors 180e. The lower connectors 160e and the intermediate connectors 170e may be understood with reference to the descriptions of the lower connectors 160b and 160d, the bottom connectors 165c, and the intermediate connectors 170d shown in FIGS. 2B through 2D. The intermediate adhesion parts 175e may be formed on the intermediate connectors 170e. Although each of the intermediate adhesion parts 175e has an elliptical sectional shape, the inventive concepts is not limited thereto. For example, each of the intermediate adhesion parts 175e may have a spherical or hemispherical shape. In this case, the shape of the intermediate adhesion parts 175e may be understood with reference to the descriptions of the lower connectors 160b and 160d shown in FIGS. 2B and 2D. In an embodiment, the center of the intermediate adhesion parts 175e may be formed above or below top surfaces of the intermediate connectors 170e. The lower connectors 160e, the intermediate adhesion parts 175e, and the upper connectors 180e may include a solder material.

Figure 2F:
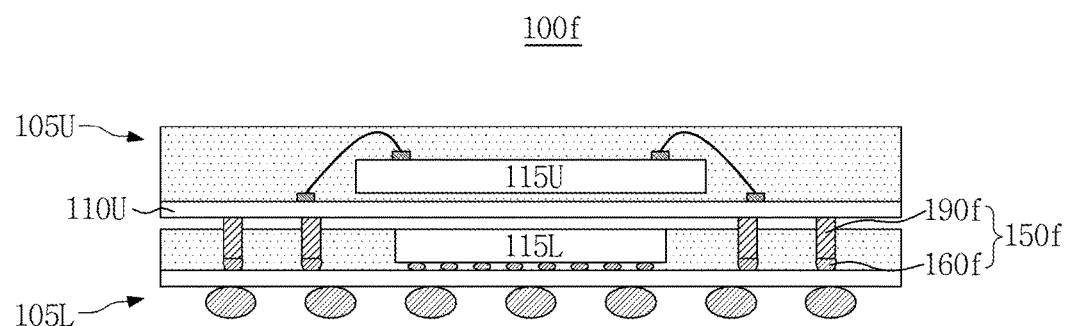

Referring to FIG. 2F, an apparatus 100f may include a lower semiconductor package 105L, an upper semiconductor package 105U, and inter-package connectors 150f configured to electrically connect the lower and upper semiconductor packages 105L and 105U. The upper semiconductor package 105U is stacked on the lower semiconductor package 105L. The inter-package connectors 150f may include lower connectors 160f and package bumps 190f. The lower connectors 160f may be understood with reference to FIG. 2A and the description thereof. Each of the package bumps 190f may comprise a metal and may have a stud, stick, or pillar shape. The package bumps 190f may be fabricated using an additional process and attached or fixed to the upper package substrate 110U. The package bumps 190f may comprise copper (Cu). A metallic barrier layer comprising, for example, a nickel (Ni) barrier layer, may be formed on the surfaces of the package bumps 190f. The lower and upper connectors 160d and 180d may include a solder material.

Figure 2G:
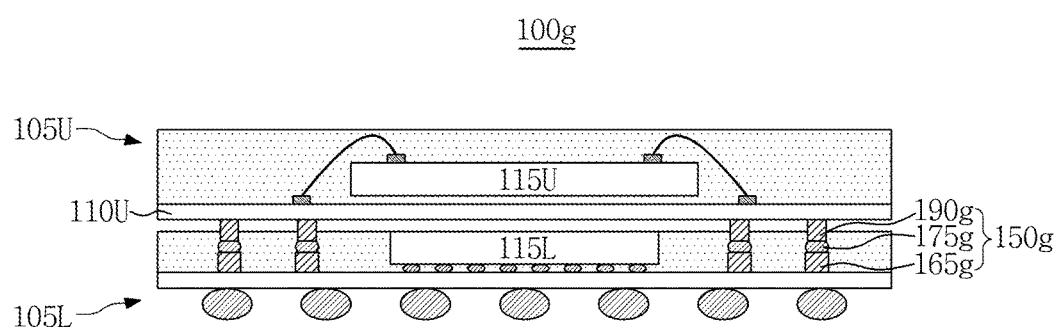

Referring to FIG. 2G, an apparatus 100g may include a lower semiconductor package 105L, an upper semiconductor package 105U, and inter-package connectors 150g configured to electrically connect the lower and upper semiconductor packages 105L and 105U. The upper semiconductor package 105U is stacked on the lower semiconductor package 105L. The inter-package connectors 150g may include bottom connectors 165g, intermediate adhesion parts 175g, and package bumps 190g. The bottom connectors 165g, the intermediate connectors 175g, and the package bumps 190g may be understood with reference to FIGS. 2C through 2G and the descriptions thereof.

Figure 2H:
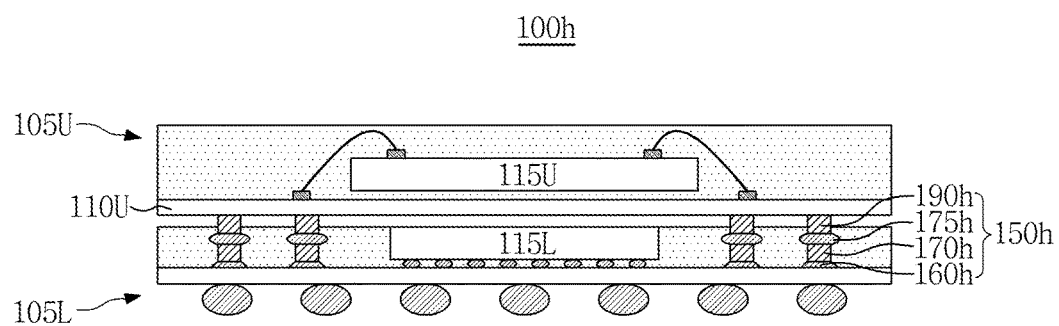

Referring to FIG. 2H, an apparatus 100h may include a lower semiconductor package 105L, an upper semiconductor package 105U, and inter-package connectors 150h configured to electrically connect the lower and upper semiconductor packages 105L and 105U. The upper semiconductor package 105U is stacked on the lower semiconductor package 105L. The inter-package connectors 150h may include lower connectors 160h, intermediate connectors 170h, intermediate adhesion parts 175h, and package bumps 190h. The lower connectors 160h, the intermediate connectors 170h, the intermediate adhesion parts 175h, and the package bumps 190h may be understood with reference to FIGS. 2B through 2G and the descriptions thereof.

Figure 3A:
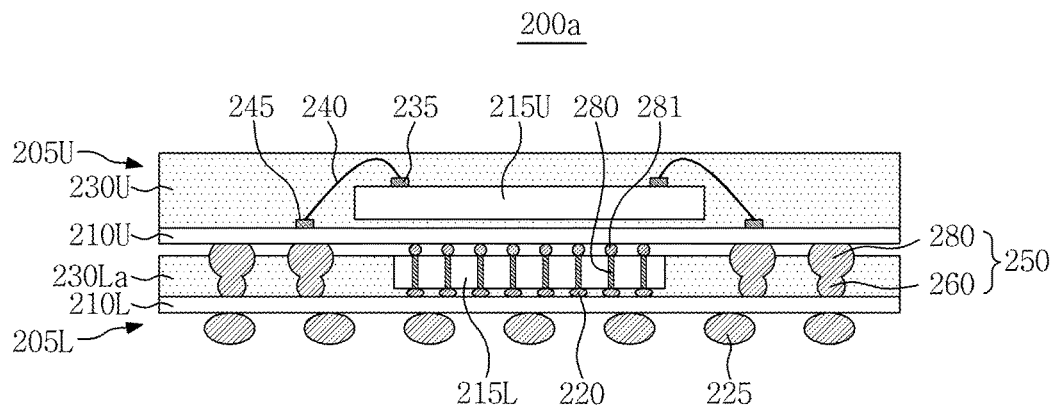
FIGS. 3A and 3B are schematic longitudinal sectional views of apparatuses including chip connectors according to embodiments of the inventive concepts.
Figure 3B:
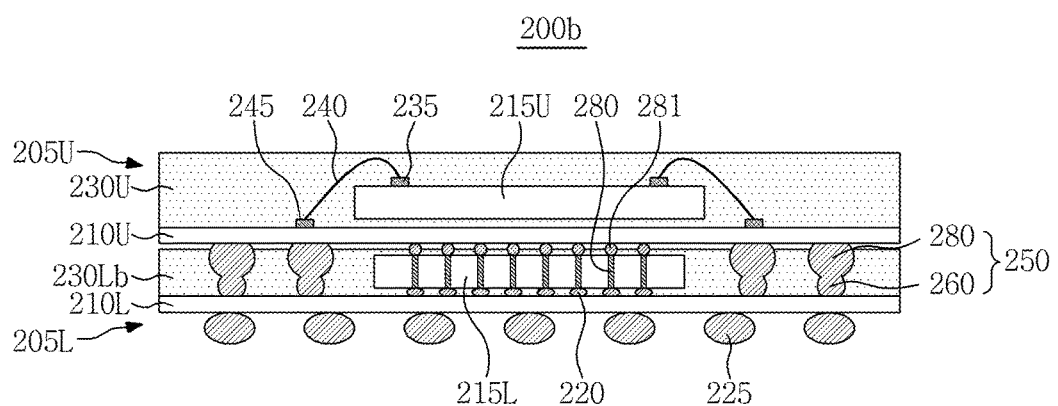

FIGS. 3A and 3B are schematic longitudinal sectional views of apparatuses including chip connectors according to embodiments of the inventive concepts.

Referring to FIG. 3A, an apparatus 200a may include a lower semiconductor package 205L including a lower semiconductor chip 215L having chip connectors 281, an upper semiconductor package 205U, and inter-package connectors 250 configured to electrically connect the lower and upper semiconductor packages 205L and 205U. The upper semiconductor package 205U is stacked on the lower semiconductor package 205L. The lower semiconductor package 205L may include a lower molding compound 230La, which exposes a top surface of the lower semiconductor chip 215L. The chip connectors 281 may be disposed on the top surface of the lower semiconductor chip 215L and physically and/or electrically connected to a bottom surface of the upper package substrate 210U. The chip connectors 281 may electrically connect the lower and upper semiconductor chips 215L and 215U. The lower semiconductor chip 215L may include through silicon vias (TSVs) 280 formed vertically passing through the main body. The TSVs 280 may electrically connect the chip bumps 220 and the chip connectors 281. Although it is illustrated that the chip connectors 281 are aligned with the chip bumps 220, the chip connectors 281 may not be aligned with the chip bumps 220. In an exemplary embodiment, redistribution interconnections may be formed on the lower semiconductor chip 215L to electrically connect the chip bumps 281 and the TSVs 280.

The chip connectors 281 may transmit a clock signal, command signals, an address signal, and/or data signals. The inter-package connectors 250 may transmit supply voltages, ground voltages, and/or test signals. In an exemplary embodiment, the chip connectors 281 may transmit the supply voltages or ground voltages, and the inter-package connectors 250 may transmit the effective signals. According to an exemplary embodiment, the chip connectors 281 may transmit the ground voltages, and the inter-package connectors 250 may transmit the supply voltages. According to an exemplary embodiment, when the lower semiconductor chip 215L is a logic device and the upper semiconductor chip 215U is a memory device, the chip connectors 281 may electrically connect shielding ground interconnections of the lower semiconductor chip 215L with ground interconnection lines of the upper semiconductor chip 215U. The shielding ground interconnections may be disposed between signal transmission lines in logic devices. The shielding ground interconnections may prevent or reduce interference of electric signals transmitted through the signal transmission lines. In an exemplary embodiment, the ground voltages may be transmitted through the inter-package connectors 250. In an exemplary embodiment, the chip connectors 281 and the inter-package connectors 250 may perform different signal transmission functions.

The chip connectors 281 may comprise a solder material.

Referring to FIG. 3B, an apparatus 200b may include a lower semiconductor package 205L including a lower semiconductor chip 215L having chip connectors 281, an upper semiconductor package 205U, and inter-package connectors 250 configured to electrically connect the lower and upper semiconductor packages 205L and 205U. The upper semiconductor package 205U is stacked on the lower semiconductor package 205L. The lower semiconductor package 205L may include a lower molding compound 230Lb, which covers a top surface of the lower semiconductor chip 215L. The lower molding compound 230Lb may surround bottom surfaces and/or lateral surfaces of the chip connectors 281. In other words, the lower molding compound 230Lb exposes a portion of the chip connectors 281.

Figure 4:
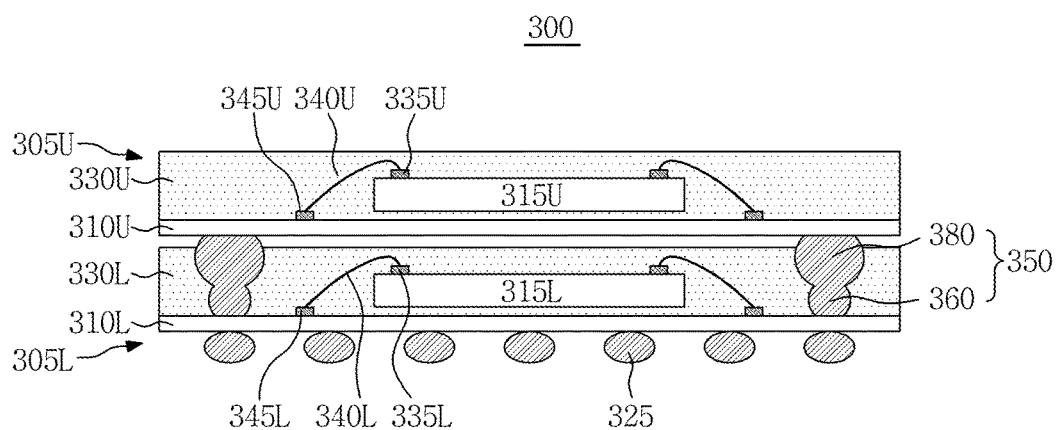
FIG. 4 is schematic longitudinal sectional view of an apparatus according to an embodiment of the inventive concepts.

FIG. 4 is schematic longitudinal sectional view of an apparatus according to an embodiment of the inventive concepts.

Referring to FIG. 4, an apparatus 300 may include a lower semiconductor package 305L including a lower package substrate 310L and a lower semiconductor chip 315L, an upper semiconductor package 305U, and inter-package connectors 350 configured to electrically connect the lower and upper semiconductor packages 305L and 305U. The upper semiconductor package 305U is stacked on the lower semiconductor package 305L. The lower package substrate 310L and the lower semiconductor chip 315L may be electrically connected to each other by a bonding wire 340L. Each of the lower and upper semiconductor packages 305L and 305U may include a memory device according to an exemplary embodiment. That is, each of the lower and upper semiconductor chips 315L and 315U may be a memory device. In an exemplary embodiment, each of the inter-package connectors 350 may include a lower connector 360 and an upper connector 380. That is, each of the inter-package connectors 350 may include a stack structure of at least two components. In an exemplary embodiment, the lower connectors 360 may be smaller than the upper connectors 380. In an exemplary embodiment, the boundary (or, the cusp or waist) between the lower connector 360 and the upper connector 380 can be disposed below the top surface of the lower semiconductor chip 315L. According to an exemplary embodiment, when the size of the lower connectors 360 is reduced and the size of the upper connectors 380 is increased, the arrangement of the inter-package connectors 350 may be finer such that the distance between each inter-package connector 350 is closer.

The apparatus described with reference to FIG. 4 may be applied also to the various apparatuses 100b to 100h, 200a and 200b described with reference to FIGS. 2B to 3B. In other words, each of the various package connectors 150a to 150h, 250, and 250 of FIGS. 2A through 3B may include upper components and lower components, and the lower components may be formed below the top surfaces of the lower semiconductor chips. The upper components may include upper connectors 180a to 180e and 280 or package bumps 190f to 190h. The lower components may selectively include lower connectors 160a, 160b, 160d to 160f, 160h, and 260, bottom connectors 165c and 165g, intermediate connectors 170d to 170e and 170h, and/or intermediate adhesion parts 175e and 175g, and 175h. In an embodiment, when the greatest height of the lower components is lower than a height of the top surface of the lower semiconductor chip 315L, the greatest height of the upper components may be increased. As the height of the upper components increases, a process of forming the apparatuses 100b to 100h, 200a, and 200b of the semiconductor packages may be stabilized.

FIGS. 5A through 5D are schematic longitudinal sectional views of chip connectors and connection structures thereof according to embodiments of the inventive concepts. FIGS. 5A through 5D illustrate that the chip connectors are formed between lower semiconductor chips and upper package substrates, and top surfaces of the lower semiconductor chips are exposed.

Figure 5A:
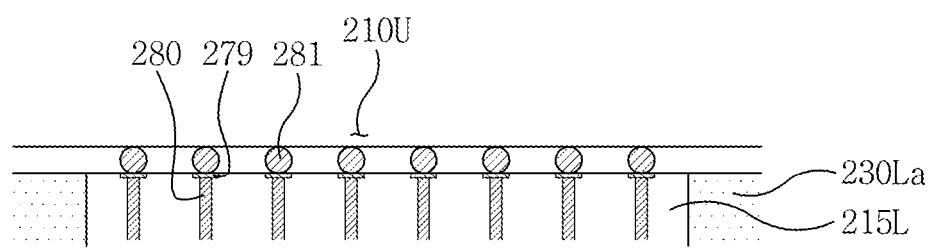
FIGS. 5A through 5D are schematic longitudinal sectional views of chip connectors and connection structures thereof according to embodiments of the inventive concepts.

Referring to FIG. 5A, chip connectors 281 may comprise a single spherical body between a lower semiconductor chip 215L and an upper package substrate 210U. The chip connectors 281 may comprise a solder material. According to an exemplary embodiment, a lateral surface of the lower semiconductor chip 215L may be surrounded by a molding compound 230, and a top surface of the lower semiconductor chip 215L may be exposed. The chip connectors 281 may be electrically connected to TSVs 280. The chip connectors 281 may be electrically connected to the TSVs 280 by redistribution interconnections 279. From a plan view, the redistribution interconnections 279 may have, for example, a pad, bar, or line shape. The pads may electrically connect at least two chip connectors 281 or TSVs 280. The chip connectors 281, the redistribution interconnections 279, and/or the TSVs 280 of FIG. 5A may be applied to apparatuses 100a to 100h of FIGS. 2A through 2H. That is, apparatuses 100a to 100h may further include the chip connectors 281, the redistribution interconnections 279, and/or the TSVs 280.

Figure 5B:
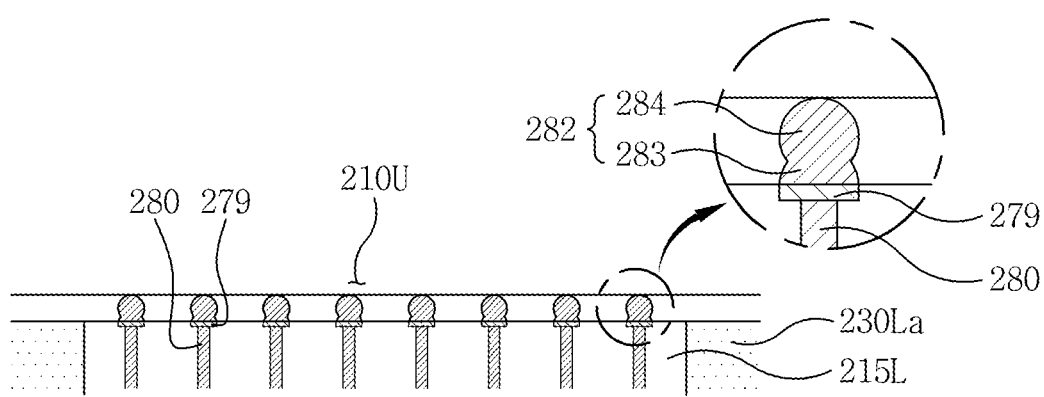

Referring to FIG. 5B, chip connectors 282 including lower chip connectors 283 and upper chip connectors 284 may be formed between the lower semiconductor chip 215L and the upper package substrate 210L. The lower chip connectors 283 and the upper chip connectors 284 may include a solder material. The lower chip connectors 283 may be understood with reference to the lower connectors 160a, 160b, 160d, 160e, 160f, and 160h shown in FIGS. 2A, 2B, 2D, 2F, and 2H. The upper chip connectors 284 may be understood with reference to the upper connectors 180a to 180e of FIGS. 2A through 2E. In an exemplary embodiment, redistribution interconnections 279 and TSVs 280 may be formed.

Figure 5C:
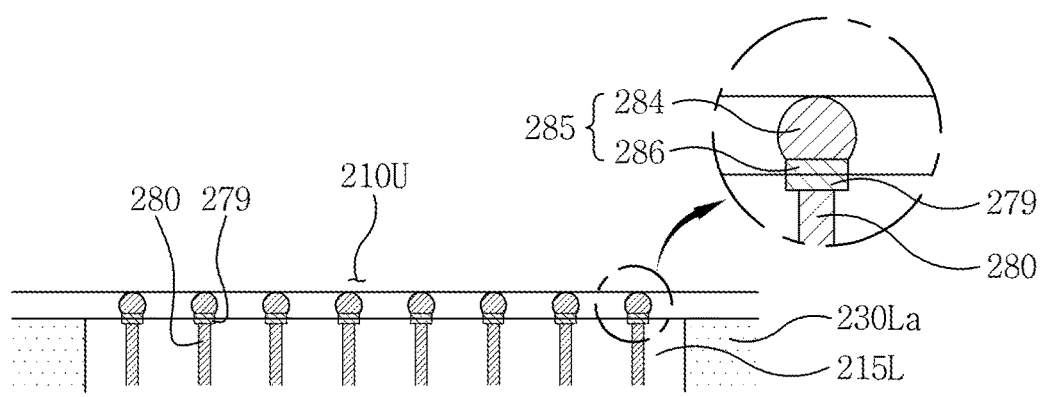

Referring to FIG. 5C, chip connectors 285 including bottom chip connectors 286 and upper chip connectors 284 may be formed between the lower semiconductor chip 215L and the upper package substrate 210U. The bottom chip connectors 286 may be formed as a mesa or pillar shape. The bottom chip connectors 286 may be attached to one surface of the lower semiconductor chip 215L. The bottom chip connectors 286 may comprise metal. The bottom chip connectors 286 may be understood with reference to the bottom connectors 165c, 165d, 165e, 165g, and 165h shown in FIGS. 2C, 2D, 2E, and 2H. The upper chip connectors 284 may be understood with reference to the upper connectors 180a to 180e of FIGS. 2A through 2E and FIG. 5B. In an exemplary embodiment, redistribution interconnections 279 and TSVs 280 may be formed.

Figure 5D:
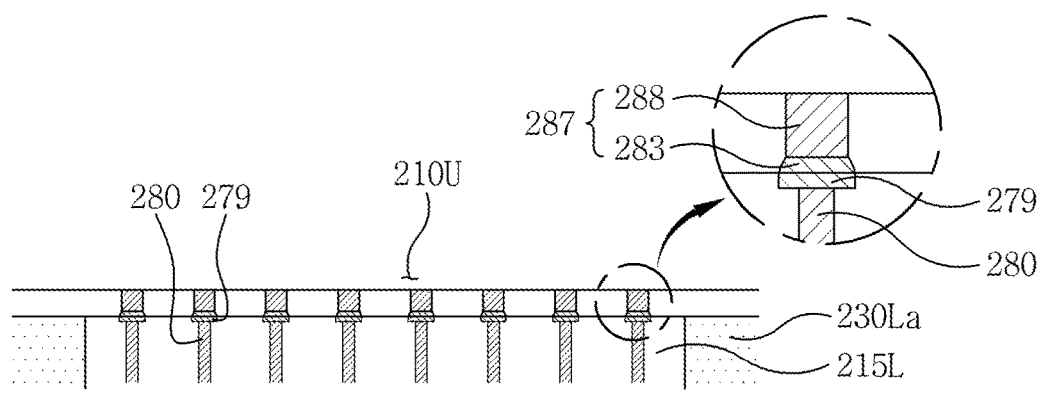
Figure 6A:
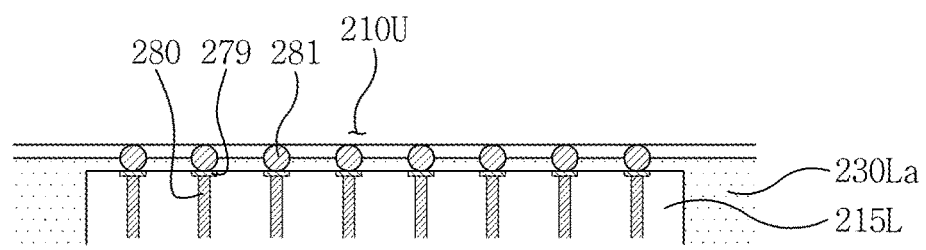
FIGS. 6A through 6D are schematic longitudinal sectional views of chip connectors and connection structures thereof according to embodiments of the inventive concepts.
Figure 6B:
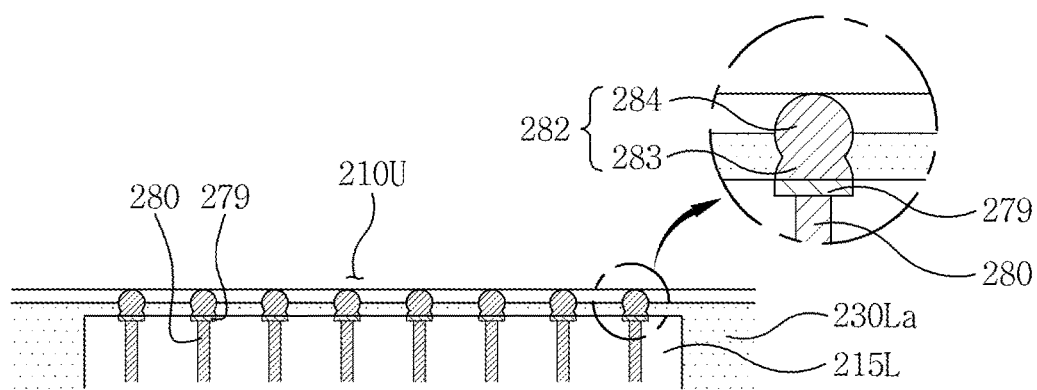
Figure 6C:
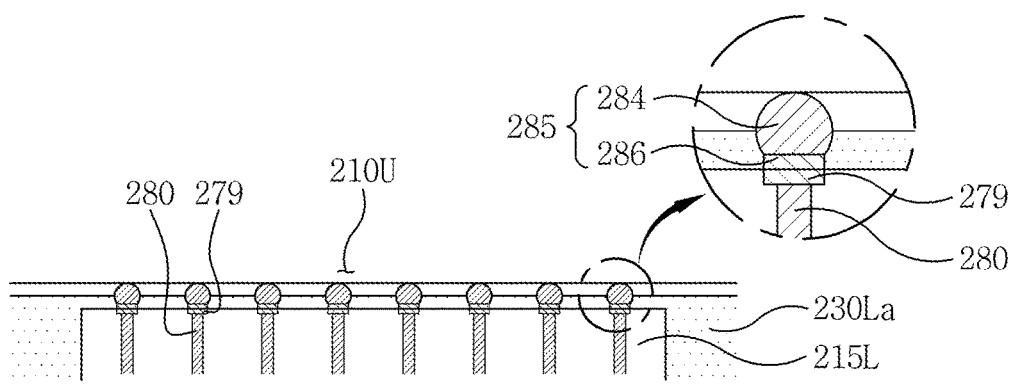
Figure 6D:
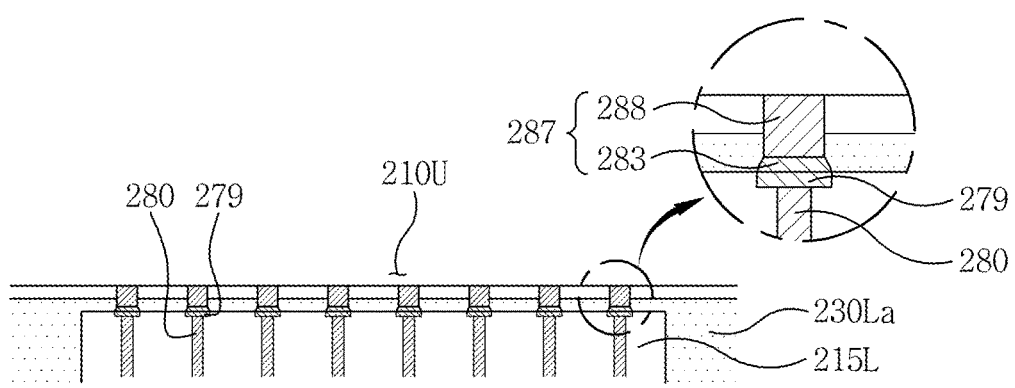

Referring to FIG. 5D, chip connectors 287 including lower chip connectors 283 and chip connection bumps 288 may be formed between the lower semiconductor chip 215L and the upper package substrate 210U. The lower chip connectors 283 may be understood with reference to the lower connectors 160a, 160b, 160d, 160e, 160f, and 160h of FIGS. 2A, 2B, 2D, 2E, 2F, and 2H and FIG. 5B. The chip connection bumps 288 may comprise, for example, metal. The chip connection bumps 288 may have a stud, stick, or pillar shape. The chip connection bumps 288 may be fabricated using an additional process and fixed to the upper package substrate 210U. The chip connection bumps 288 may be understood with reference to the package bumps 190f, 190g, and 190h of FIGS. 2F, 2G, and 2H. In an exemplary embodiment, redistribution liens 279 and TSVs 280 may be formed.

FIGS. 6A through 6D are schematic longitudinal sectional views of chip connectors and connection structures thereof according to embodiments of the inventive concepts. FIGS.

6A through 6D illustrate that the chip connectors are formed between lower semiconductor chips and upper package substrates, and top surfaces of the lower semiconductor chips are partially or wholly covered with a lower molding compound. Various chip connectors that will now be illustrated and described may have similar structural shapes as the inter-package connectors 150a to 150h of FIGS. 2A through 2H and/or the chip connectors 281, 282, 285, and 287 of FIGS. 5A through 5D. According to exemplary embodiments, the sizes of the chip connectors may be variously determined according to design rules.

Referring to FIGS. 6A through 6D, the lower molding compound 230La may cover a top surface of the lower semiconductor chip 215L. Thus, bottom and lateral surfaces of the chip connectors 281, 282, 285, and 287 may be partially or wholly surrounded by the lower molding compound 230La. In an exemplary embodiment, the bottom and/or lateral surfaces of the chip connectors 281, 282, 285, and 287 may be partially exposed from the lower molding compound 230La. According to an exemplary embodiment, redistribution interconnections 279 and TSVs 280 may be formed.

FIGS. 7A through 7D are schematic longitudinal sectional views of various inter-package connectors according to embodiments of the inventive concepts. The substantially round or circular shapes are shapes of various inter-package connectors and/or chip connectors before a reflow process is performed.

The various connectors may refer to any one or portion of the various inter-package connectors and chip connectors shown in FIGS. 1A through 6D.

Figure 7A:
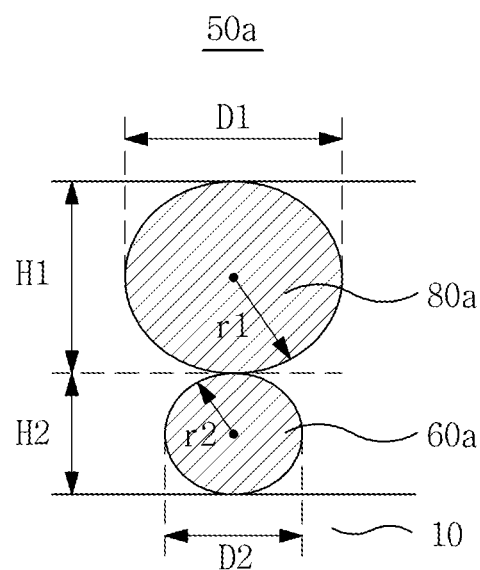
FIGS. 7A through 7D are schematic longitudinal sectional views of various inter-package connectors according to embodiments of the inventive concepts.

Referring to FIG. 7A, a connector 50a may include a lower connector 60a and an upper connector 80a. In an exemplary embodiment, the upper connector 80a may have a greater volume than the lower connector 60a. In an exemplary embodiment, a vertical height H1 of the upper connector 80a may be greater than a vertical height H2 of the lower connector 60a. In an exemplary embodiment, a horizontal width D1 of the upper connector 80a may be greater than a horizontal width D2 of the lower connector 60a. From a plan view or cross-sectional view, the horizontal widths D1 and D2 may be understood as diameters of the upper connector 80a and the lower connector 60a, respectively. In an exemplary embodiment, a radius or curvature r1 of the upper connector 80a may be greater than a radius or curvature r2 of the lower connector 60a. The lower connector 60a and the upper connector 80a may include a solder material. Thus, the lower connector 60a and the upper connector 80a may be formed using a soldering process, and the upper and lower connectors 80a and 60a may have a spherical or hemispherical shape.

Figure 7B:
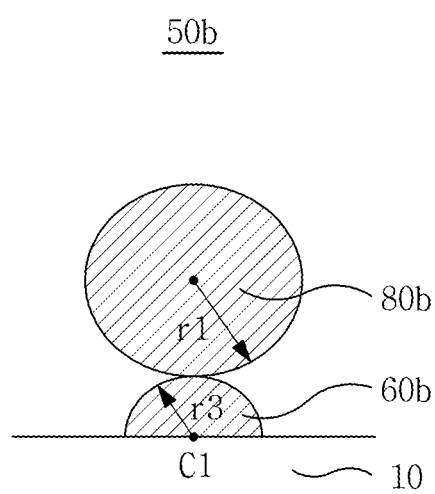

Referring to FIG. 7B, a connector 50b may include a lower connector 60b and an upper connector 80b, and the upper connector 80b may have a greater volume than the lower connector 60b. An imaginary center C1 of the lower connector 60b may be disposed at the same level as a bottom surface 10. The imaginary center C1 may be interpreted as the center of an imaginary radius or curvature r3 of the lower connector 60b. The lower connector 60b and the upper connector 80b may include a solder material. In an exemplary embodiment, the lower connector 60b may have a hemispherical shape.

Figure 7C:
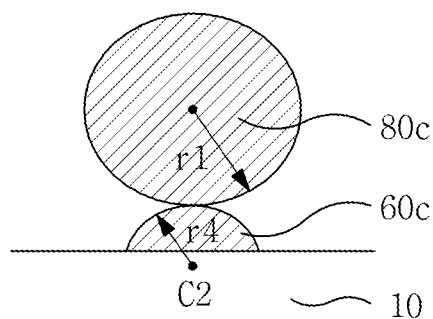

Referring to FIG. 7C, a connector 50c may include a lower connector 60c and an upper connector 80c. In an exemplary embodiment, the upper connector 80c may have a greater volume than the lower connector 60c. An imaginary center C2 of the lower connector 60c may be at a lower level than a bottom surface 10. The imaginary center C2 may be interpreted as the center of an imaginary radius or curvature r4 of the lower connector 60c.

Figure 7D:
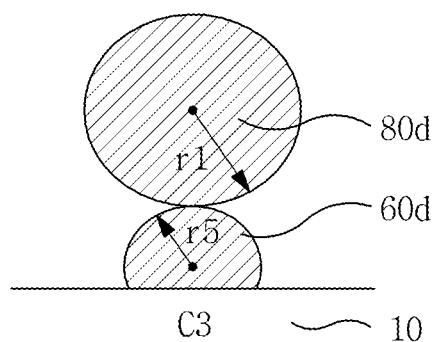

Referring to FIG. 7D, a connector 50d may include a lower connector 60d and an upper connector 80d, and the upper connector 80d may have a greater volume than the lower connector 60d. An imaginary center C3 of the lower connector 60d may be at a higher level than the bottom surface 10. The imaginary center C3 may be interpreted as the center of an imaginary radius or curvature r5 of the lower connector 60d.

According to embodiments of the inventive concepts, the upper connectors 80a to 80d may be formed to be higher, wider, and larger than the lower connectors 60a to 60d. The lower connectors 60a to 60d may be formed using a screen print process or soldering process according to an exemplary embodiment. The upper connectors 80a and 80b may be formed using a soldering process according to an exemplary embodiment. According to an exemplary embodiment, a process of connecting the upper connectors 80a to 80d and the lower connectors 60a to 60d may be performed within a via hole formed using a laser drilling process. The formation of the via hole may include selectively removing a molding compound to partially expose surfaces of the lower connectors 60a to 60d. The laser drilling process may enable to form finer and more equal distanced via holes than the screen print process. Therefore, a laser drilling process may be performed to enable elaborate arrangement of the connectors 50a. As the size of the lower connectors 60a to 60d decreases, the screen print process may not contribute toward elaborately arranging the lower connectors 60a to 60d, and as the size of the upper connectors 80a to 80d increases, the laser drilling process may contribute toward elaborately arranging the upper connectors 80a to 80d. Thus, the upper connectors 80a to 80d may have a greater size than the lower connectors 60a to 60d to make the connectors 50a to 50d more elaborate. For example, the connectors can be formed with substantially equal distances between them. For example, more numbers of connectors can be formed in a given area. In an exemplary embodiment, before performing a reflow process to connect the lower connectors 60a to 60d with the upper connectors 80a to 80d, respectively, the upper connectors 80a to 80d may be dipped in a flux. A sufficient amount of flux may be applied to the surfaces of the upper connectors 80a to 80d so that the reflow process can be stably carried out. In other words, as the size of the upper connectors 80a to 80d increases, a larger amount of flux may be applied to the surfaces of the upper connectors 80a to 80d. Accordingly, the upper connectors 80a to 80d may be formed to the greatest possible size while minimizing a distance between the upper connectors 80a to 80d. In general, the upper package substrate 110U may be uneven. During a semiconductor package fabrication process, the upper package substrate 110U may not maintain flatness. That is, the upper package substrate 110U may be bent. Thus, when the upper connectors 80a to 80d are not formed to have a sufficiently large size, a sufficient amount of flux may not be applied to the surfaces of the upper connectors 80a to 80d. Accordingly, the upper connectors 80a to 80d are formed to have a greater size than the lower connectors 60a to 60d according to exemplary embodiments of the inventive concepts.

FIGS. 8A through 8I are shapes of various connectors of package stack structures according to embodiments of the inventive concepts. Here, the shapes may be interpreted as finally formed shapes of respective components. The various connectors may refer to any one or portion of the various inter-package connectors and chip connectors shown in FIGS. 1A through 6D. Generally, these shapes of the connectors are generated after a reflow process. The reflow process can be used when a lower connector is formed on a substrate. The reflow process can be used when an upper connector is formed on a substrate. The reflow process can be used when the lower connector and the upper connector are combined.

Figure 8A:
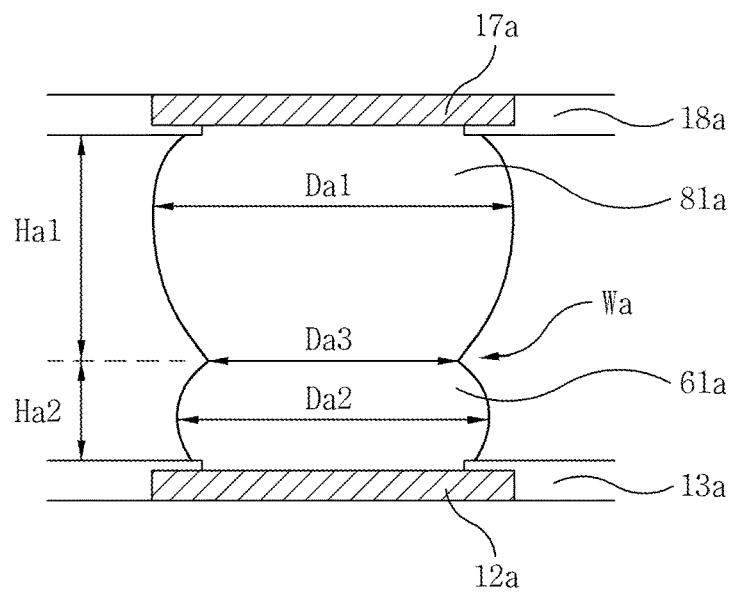
FIGS. 8A through 8I are schematic diagrams of real shapes of various connectors of package stack structures according to the general inventive concepts.

Referring to FIG. 8A, a connector 51a may include a waist portion Wa and be formed to physically and/or electrically connect a lower land 12a and an upper land 17a. The waist portion Wa refers to a slender portion of the connector 51a. The waist portion Wa may imaginarily and/or visually divide the connector 51a into an upper part and a lower part. In other words, the waist portion Wa may divide the connector 51a into an upper connector 81a and a lower connector 61a. The maximum width Da1 of the upper connector 81a may be more than the maximum width Da2 of the lower connector 61a. A width Da3 of the waist portion Wa may be less than the maximum width Da2 of the lower connector 61a. Thus, the waist portion Wa refers to a portion having a smallest width Da3, which is interposed between the maximum width Da2 of the lower connector 61a and the maximum width Da1 of the upper connector 81a. A height Ha1 of the upper connector 81a may be defined as a distance between the surface of the upper land 17a or an upper insulating material 18a, which partially covers the upper land 17a, and the waist portion Wa. A height Ha2 of the lower connector 61a may be defined as a distance between the surface of the lower land 12a or a lower insulating material 13a, which partially covers the lower land 12a, and the waist portion Wa. The height Ha1 of the upper connector 81a may be greater than a height Ha2 of the lower connector 61a. In an embodiment, the upper connector 81a may have a greater volume than the lower connector 61a. In an embodiment, the maximum width Da1 of the upper connector 81a may be disposed above the middle of the upper connector 81a. The waist portion Wa may be formed in the horizontal direction. The upper and lower connectors 81a and 61a may include a solder material. The upper and lower connectors 81a and 61a may have a spherical or hemispherical shape. Thus, from a plan or cross-sectional view, the horizontal widths Da1, Da2, and Da3 may refer to diameters of circles.

Figure 8B:
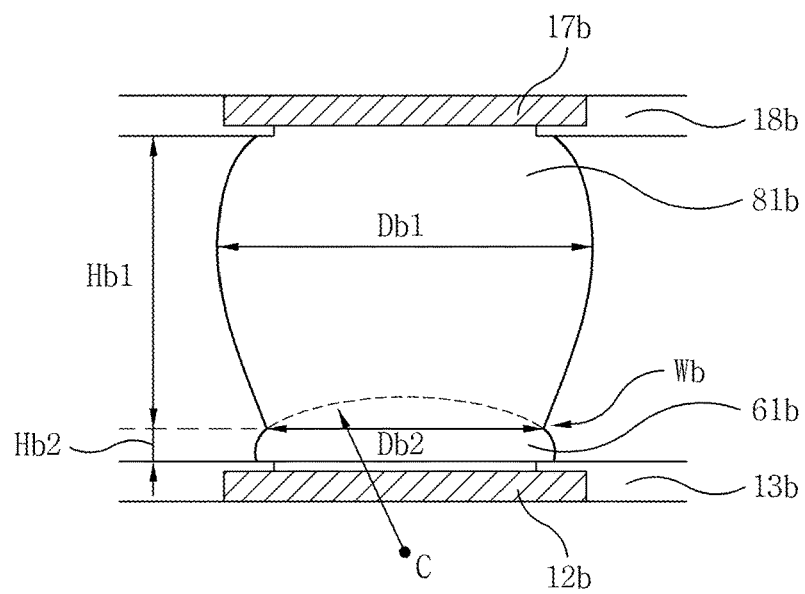

Referring to FIG. 8B, a connector 51b may include a waist portion Wb by which an upper connector 81b is divided from a lower connector 61b, and an imaginary center C of the lower connector 61b may be disposed at a lower level than the surface of the lower land 61b. A case where the imaginary center C of the lower connector 61b may be disposed at a higher level than the surface of the lower land 61b may be understood with reference to FIG. 8A. The maximum width Db1 of the upper connector 81b may be greater than a width Db2 of the waist portion Wb. A height Hb1 of the upper connector 81b may be greater than a height of the lower connector 61b.

Figure 8C:
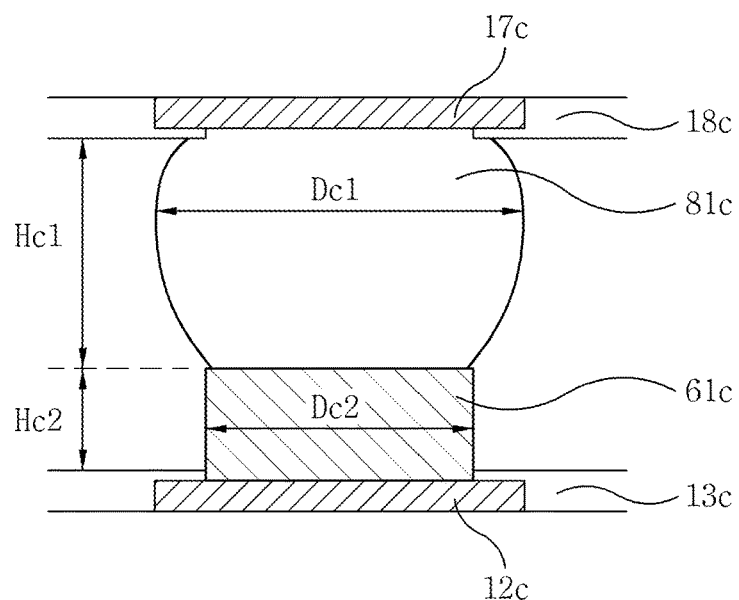

Referring to FIG. 8C, a connector 51c may include a mesa shape bottom connector 61c and a spherical upper connector 81c, and a height Hc1 of the upper connector 81c may be greater than a height Hc2 of the bottom connector 61c. The maximum width Dc1 of the upper connector 81c may be greater than a width Dc2 of the bottom connector 61c. A portion of the top surface of the mesa shape bottom connector 61c may not contact the upper connector 81c. That is, the mesa shape bottom connector 61c may be exposed.

Figure 8D:
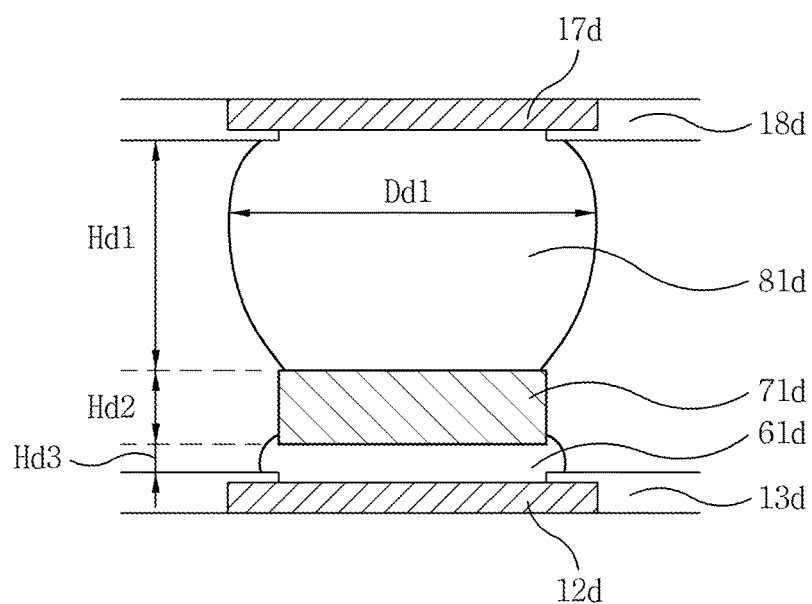

Referring to FIG. 8D, a connector 51d may include a spherical or hemispherical lower connector 61d, a mesa shape intermediate connector 71d, and a spherical upper connector 81d. A height Hd1 of the upper connector 81d may be greater than a height Hd2 of the intermediate connector 71d or a height Hd3 of the lower connector 61d. In an embodiment, the height He1 of the upper connector 81d may be greater than the sum (Hd2+Hd3) of the height Hd2 of the intermediate connector 71d and the height Hd3 of the lower connector 61d. The maximum width Dd1 of the upper connector 81d may be greater than a width Dd2 of the bottom connector 66d. A portion of the top surface of the intermediate connector 71d may not contact the upper connector 81d. That is, the portion of the top surface of the intermediate connector 71d can be exposed. A lower portion of a lateral surface of the intermediate connector 71d may be partially covered with the lower connector 61d.

Figure 8E:
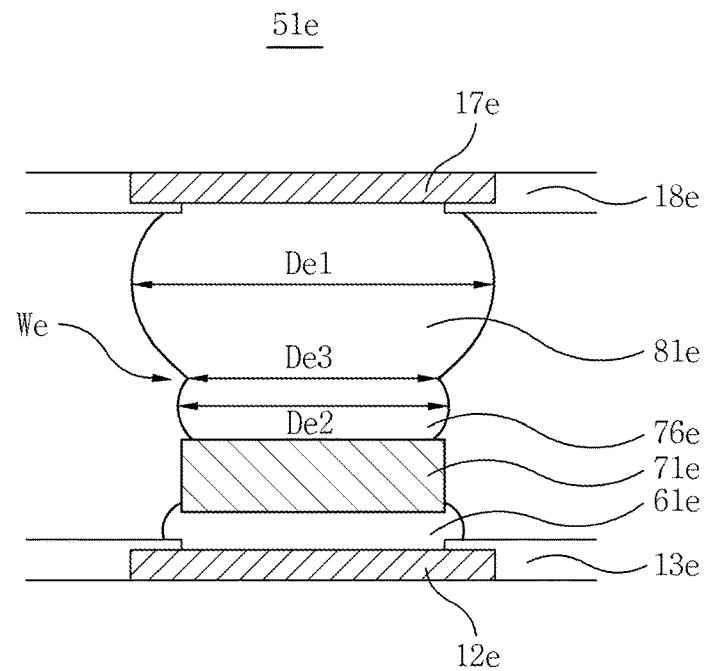

Referring to FIG. 8E, a connector 51e may include a lower connector 61e, an intermediate connector 71e, an intermediate adhesion unit 76e, and an upper connector 81e. The upper connector 81e and the intermediate adhesion unit 76e may be visually distinguished from each other on the basis of a waist portion We. The maximum width of the upper connector 81e may be greater than the maximum width De2 of the intermediate adhesion unit 76e. The greatest width of the intermediate adhesion unit 76e may be greater than the width of the waist portion We. The heights of respective components may be variously determined. For example, although it is illustrated that the upper connector 81e has a greatest height, the inventive concepts is not limited thereto. When the connector 51e has a multilayered structure, the relative heights, widths, or sizes of respective components may be variously applied.

Figure 8F:
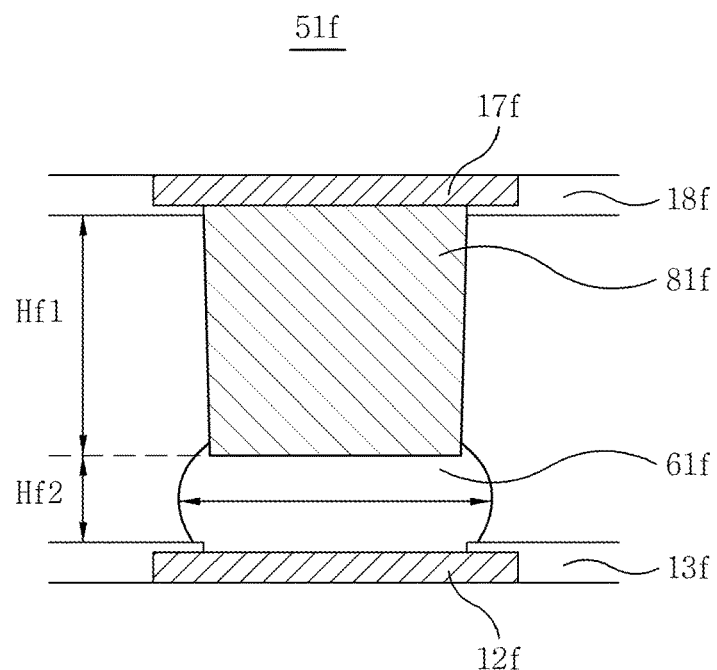

Referring to FIG. 8F, a connector 51f may include a lower connector 61f and a bump portion 81f. The bump portion 81f may comprise a metal having a stud or pillar shape. A height Hf1 of the bump portion 81f may be greater than a height Hf2 of the lower connector 61f. A lower portion of a lateral surface of the bump portion 81f may be covered with the lower connector 61f. The lower connector 61f may be formed as a spherical or hemispherical shape. An imaginary center of the lower connector 61f may be disposed above or below the surface of the lower land 12f.

Figure 8G:
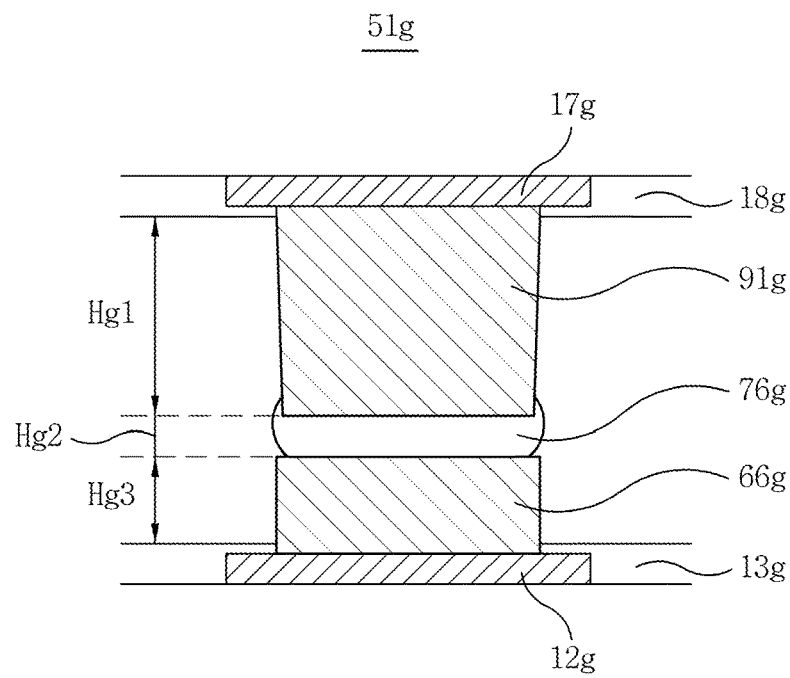

Referring to FIG. 8G, a connector 51g may include a bottom connector 66g, an intermediate adhesion unit 76g, and a bump portion 91g. A height Hg1 of the bump portion 91g may be greater than a height Hg2 of the intermediate adhesion unit 76g or a height Hg3 of the bottom connector 66g.

Figure 8H:
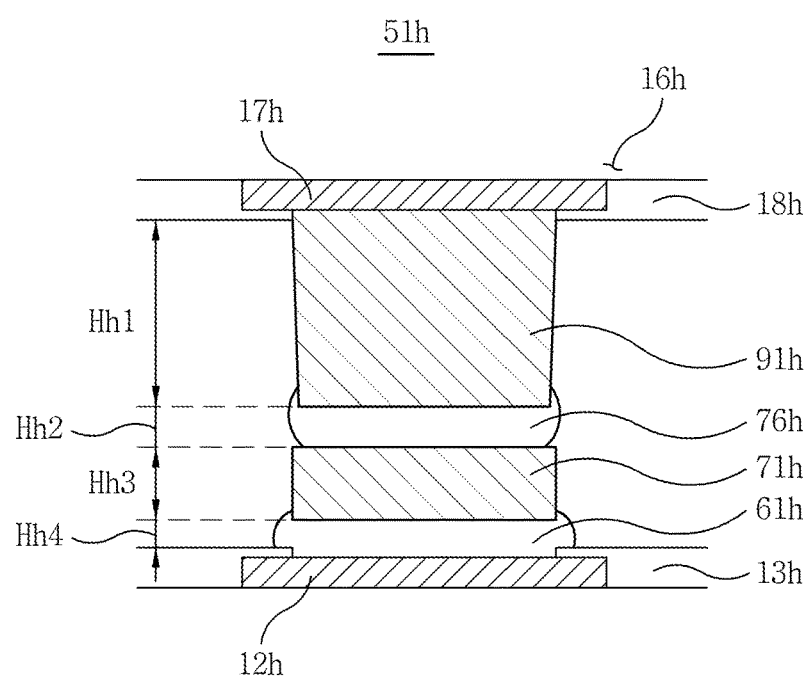

Referring to FIG. 8H, a connector 51h may include a lower connector 61h, an intermediate connector 71h, an intermediate adhesion unit 76h, and a bump portion 91h. A height Hh1 of the bump portion 91h may be greater than a height Hh2 of the intermediate adhesion unit 76h, a height Hh3 of the intermediate connector 71h, or a height Hh4 of the lower connector 61h.

Figure 8I:
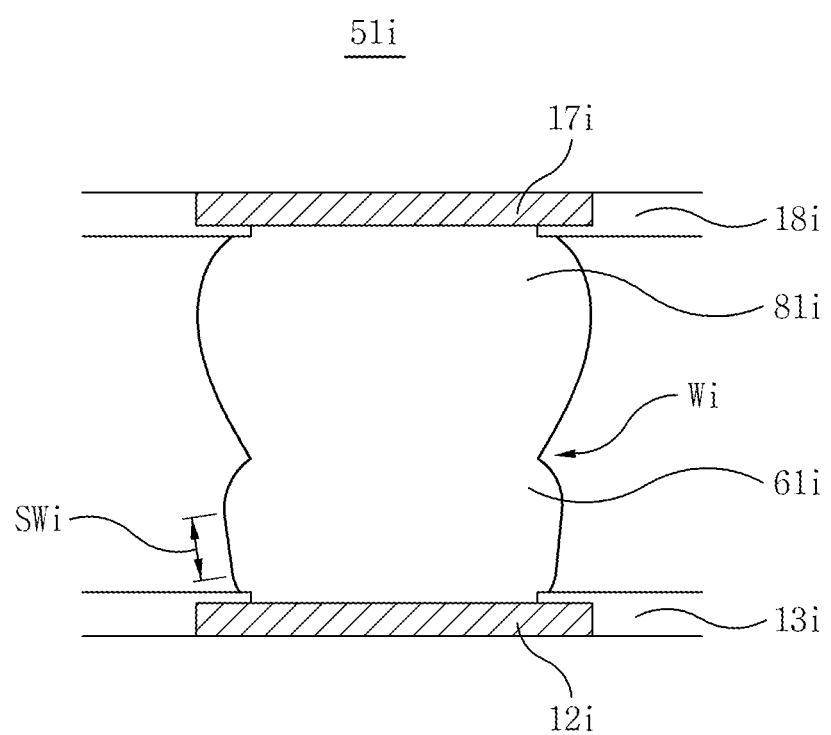

Referring to FIG. 8I, a connector 51i may include a waist portion Wi by which an upper connector 81i is divided from a lower connector 61i, and the lower connector 61i may include sidewalls having planar portions SWi. The planar portions SWi may correspond to portions of sidewalls of the lower connector 61i. The planar portions SWi may extend to a bottom portion of the lower connector 61i.

The upper lands 17a to 17i of FIGS. 8A through 8I may be included in the upper packages 105U and 205U of FIGS. 2A through 2H, 3A, and/or 3B, and the lower lands 12a to 12h may be included in the lower packages 105L and 205L or the lower semiconductor chips 115L and 215L.

FIGS. 9A through 9I are shapes of various connectors and via holes in an apparatus according to embodiments of the inventive concepts.

Figure 9A:
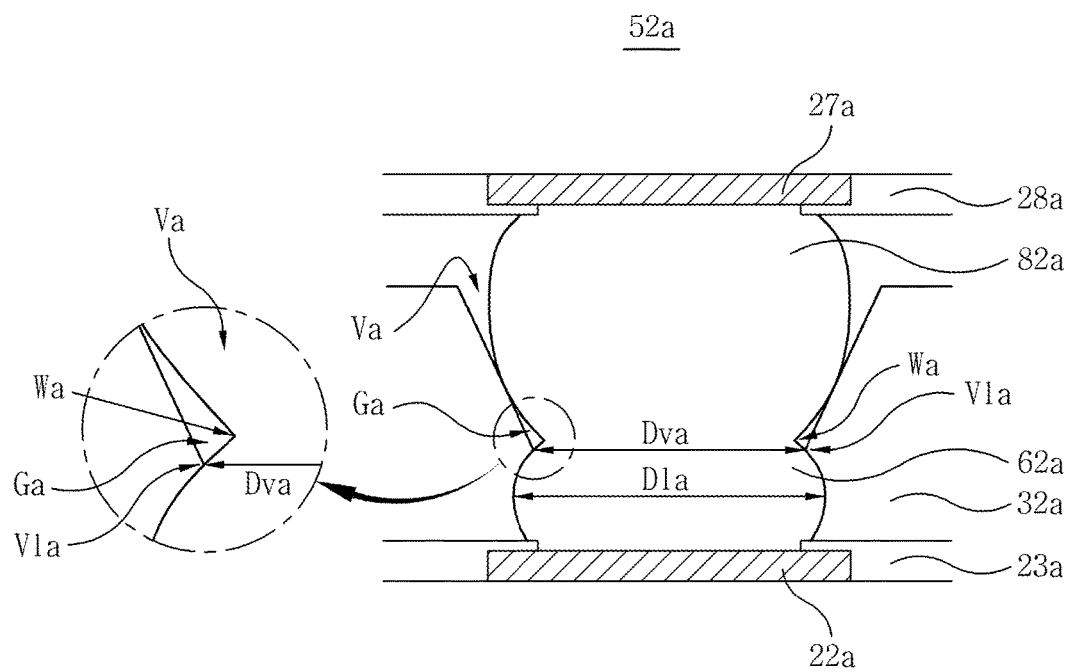
FIGS. 9A through 9I are schematic diagrams of shapes of various connectors and via holes of package stack structures according to the general inventive concepts.

Referring to FIG. 9A, a connector 52a may include a lower connector 62a and an upper connector 82a, and the upper connector 82a may be formed within a via hole Va configured to partially expose the surface of the lower connector 62a. A width Dva of a bottom end V1a of the via hole Va may be smaller than the maximum width D1a of the lower connector 62a. A gap Ga may be formed between the via hole Va and the waist portion Wa.

Figure 9B:
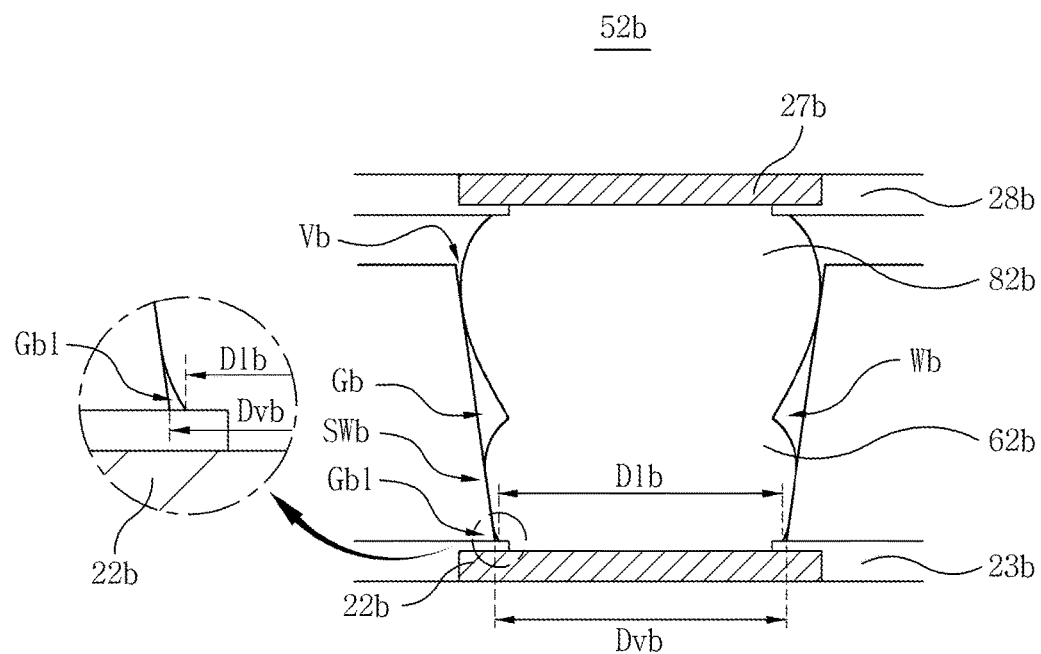

Referring to FIG. 9B, a connector 52b may include a lower connector 62b and an upper connector 82b, and the upper connector 82b may be formed within a via hole Vb configured to substantially or completely expose the surface of the lower connector 62b. The lower connector 62b may include sidewalls having planar portions SWb. A width Dvb of a bottom end of the via hole Vb may be greater than a width D1b of a bottom end of the lower connector 62b. Thus, a gap Gb1 may be formed between the via hole Vb and a bottom portion of the lower connector 62b.

Figure 9C:
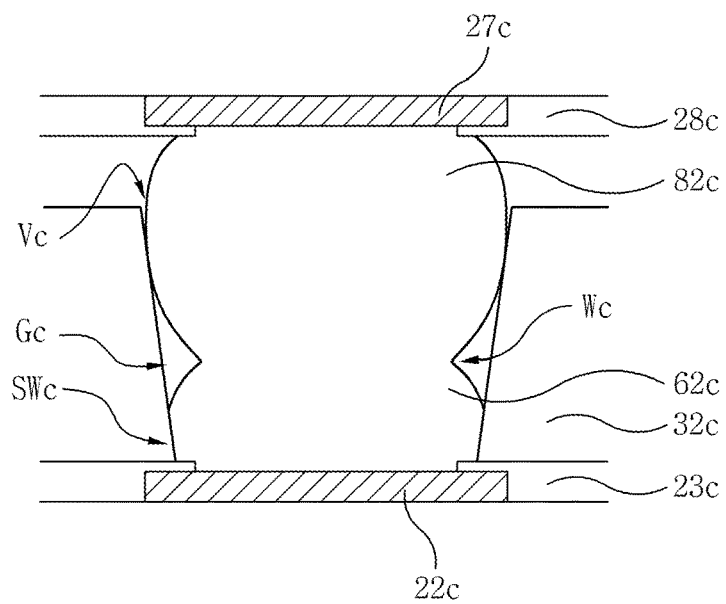

Referring to FIG. 9C, a connector 52c may include a lower connector 62c and an upper connector 82c, and the upper connector 82c may be formed within a via hole Vc configured to substantially or completely expose the surface of the lower connector 62c. The lower connector 62c may include sidewalls having planar portions SWc. The planar portions SWc may extend to a bottom surface 23c.

Gaps Ga, Gb, and Gc may be formed between the waist portions Wa, Wb, and Wc of the connectors 52a, 52b, and 52c shown in FIGS. 9A through 9C and sidewalls of the via holes Va, Vb, and Vc. The sidewalls of the via holes Va, Vb, and Vc may be inclined such that the diameters of the via holes Va, Vb, and Vc may be reduced toward lower portions thereof. The sidewalls of the via holes Va, Vb, and Vc may be inclined at respectively different angles. For example, each of the inclination sidewalls of the via holes Va, Vb, and Vc may be determined at an angle of about 10° to about 30° in consideration of intervals or pitches between the via holes Va, Vb, and Vc and other adjacent connectors. The via holes Va, Vb, and Vc may vertically penetrate molding compounds 32a, 32b, and 32c and partially expose top and/or lateral surfaces of the lower connectors 62a, 62b, and 62c or the surfaces of lower insulating materials 23a, 23b, and 23c.

Figure 9D:
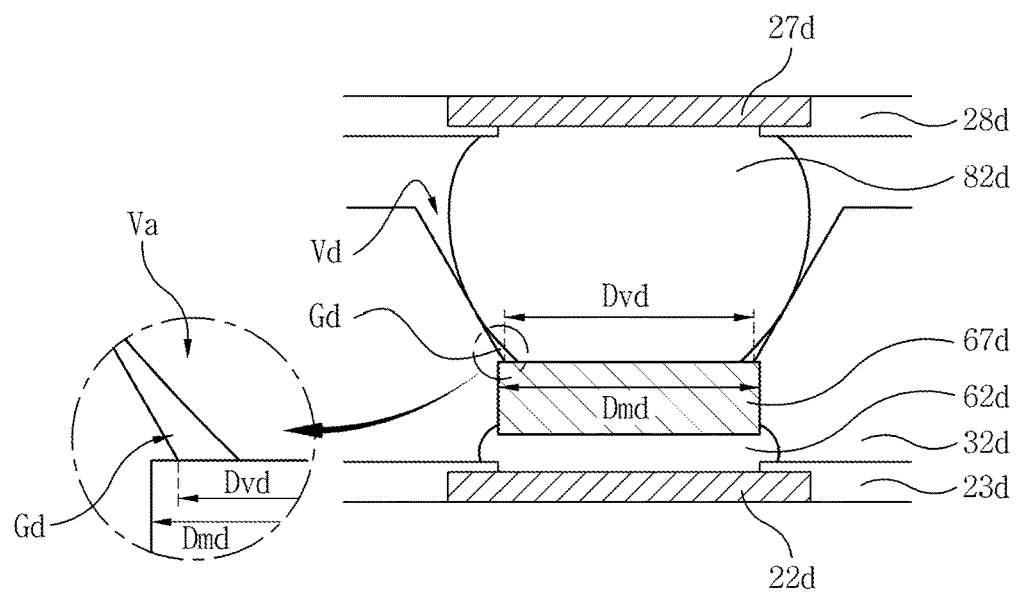

Referring to FIG. 9D, a connector 52d may include a lower connector 62d, a mesa shape connector 67d and an upper connector 82d, and the upper connector 82d may be formed within a via hole Vd configured to partially expose the surface of the mesa shape connector 67d. A width Dvd of a bottom end of the via hole Vd may be greater than a horizontal width Dmd of the mesa shape connector 67d. A gap Gd may be formed on a portion of the surface of the mesa shape connector 67d.

Figure 9E:
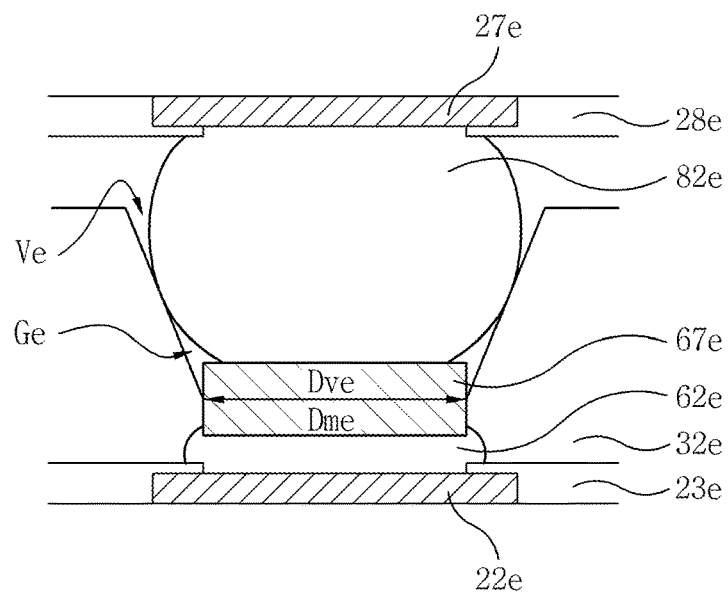

Referring to FIG. 9E, a connector 52e may include a lower connector 62e, a mesa shape connector 67e and an upper connector 82e, and the upper connector 82e may be formed within a via hole Ve configured to partially expose a lateral surface of the mesa shape connector 67e. A width Dve of a bottom end of the via hole Ve may be equal to a horizontal width of the mesa shape connector 67e. A gap Ge may be formed between a portion of the lateral surface of the mesa shape connector 67e and the sidewall of the via hole Ve.

Figure 9F:
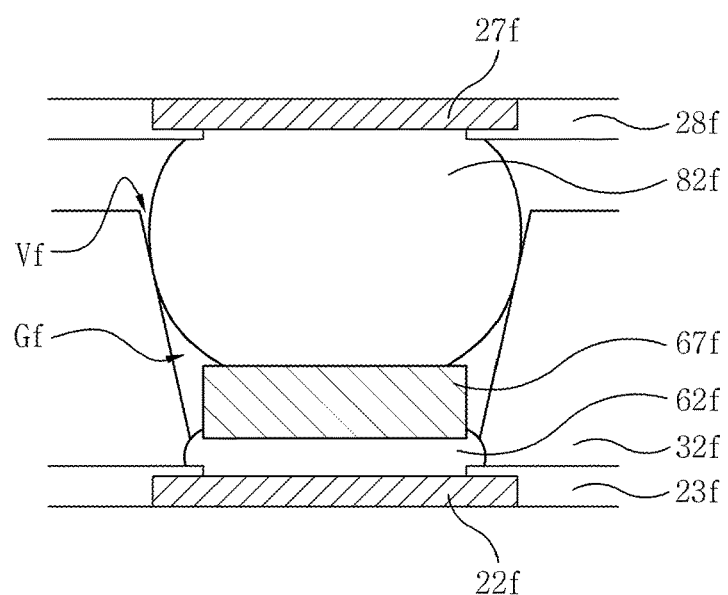

Referring to FIG. 9F, an upper connector 82f may include a lower connector 62f, a mesa shape connector 67f and an upper connector 82f, and the upper connector 82f may be formed within a via hole Vf configured to wholly expose a lateral surface of the mesa shape connector 67f. The via hole Vf may partially expose a top surface of the lower connector 62f. A gap Gf may be formed between a portion of the lateral surface of the mesa shape connector 67f and a sidewall of the via hole Vf.

According to an embodiment, in FIGS. 9D through 9F, sidewalls of the via holes Vd, Ve, and Vf may be inclined such that the diameters of the via holes Vd, Ve, and Vf may be reduced toward lower portions thereof. The via holes Vd, Ve, and Vf may vertically penetrate molding compounds 32d, 32e, and 32f and partially or wholly expose top and/or lateral surfaces of the mesa shape connectors 67d, 67e, and 67f.

Figure 9G:
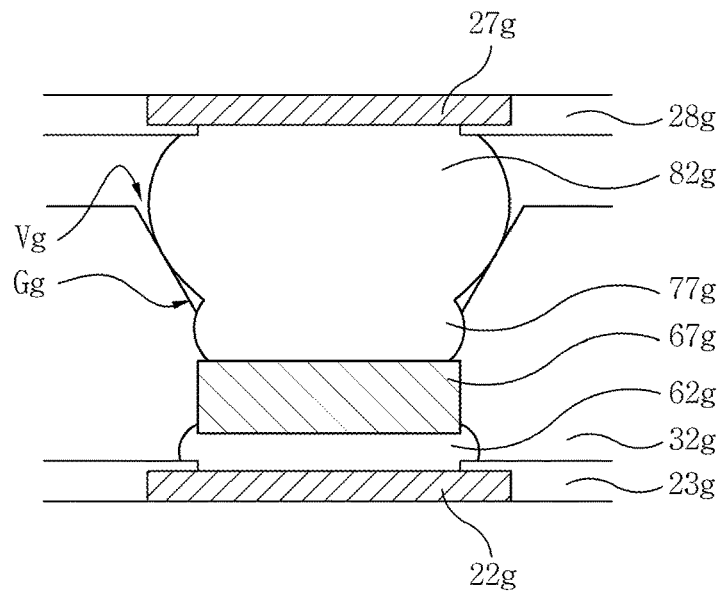

Referring to FIG. 9G, a connector 52g may include a lower connector 62g, a mesa shape connector 67g, an intermediate connector 77g, and an upper connector 82g. The upper connector 82g may be formed within a via hole Vg configured to partially expose the surface of the intermediate connector 77g. A gap Gg may be formed between a portion of the surface of the intermediate connector 77g and a sidewall of the via hole Vg.

Figure 9H:
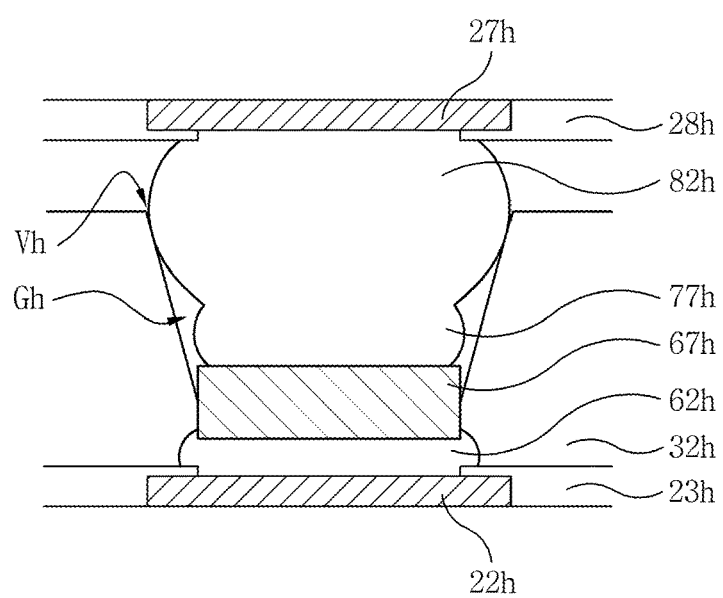

Referring to FIG. 9H, a connector 52h may include a lower connector 62h, a mesa shape connector 67h, an intermediate connector 77h, and an upper connector 82h. The upper connector 82h may be formed within a via hole Vh configured to partially expose the surface of the mesa shape connector 67h. The via hole Vh may further expose a portion of the lateral surface of the mesa shape connector 67h. A gap Gh may be formed between the portion of the surface of the mesa shape connector 67h and a sidewall of the via hole Vh.

Figure 9I:
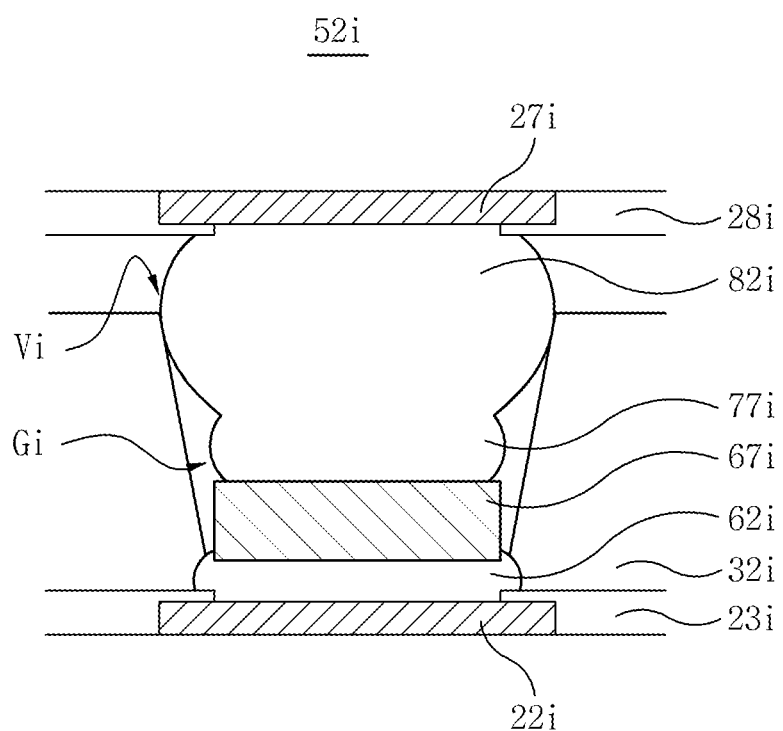

Referring to FIG. 9I, a connector 52i may include a lower connector 62i, a mesa shape connector 67i, an intermediate connector 77i, and an upper connector 82i. The upper connector 82i may be formed within a via hole Vi configured to partially expose the surface of the lower connector 62i. A gap Gi may be formed between the portion of the surface of the lower connector 62i and a sidewall of the via hole Vi.

According to an embodiment, in FIGS. 9G through 9I, sidewalls of the via holes Vg, Vh, and Vi may be inclined such that the diameters of the via holes Vg, Vh, and Vi may be reduced toward lower portions thereof. The via holes Vg, Vh, and Vi may vertically penetrate molding compounds 32g, 32h, and 32i and partially or wholly expose the surface of the intermediate connector 77h, partially or wholly expose the surface of the mesa shape connector 67h, and partially or wholly expose the surface of the lower connector 62h. The gaps Gb1 and Ga to Gi may refer to air gaps.

FIGS. 10A through 10F are schematic longitudinal sectional views illustrating a process of forming an upper package according to an embodiment of the inventive concepts.

Figure 10A:
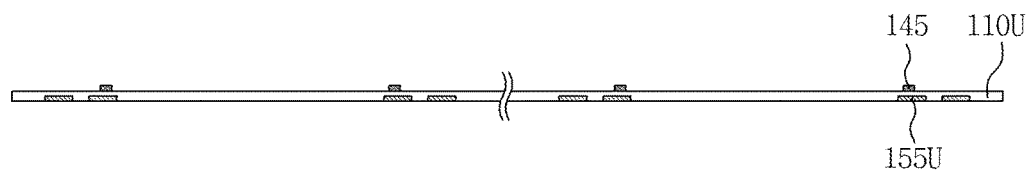
FIGS. 10A through 10F are schematic longitudinal sectional views illustrating a process of forming an upper package in a method of fabricating a stack structure of semiconductor packages according to the general inventive concepts.

Referring to FIG. 10A, an upper package substrate 110U including upper lands 155U and wire pads 145 may be prepared. The upper lands 155U may be electrically connected to the wire pads 145, respectively. The upper lands 155U and the wire pads 145 may be formed using, for example, a screen printing process, a deposition process, a bonding process, or a plating process.

Figure 10B:
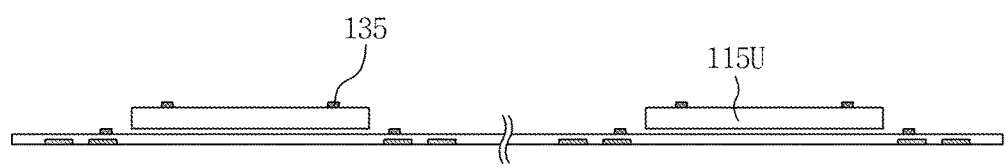

Referring to FIG. 10B, upper semiconductor chips 115U may be mounted on the upper package substrate 110U. An insulating adhesive may be interposed between the upper package substrate 110U and the upper semiconductor chips 115U. The upper semiconductor chips 115U may include bonding pads 135.

Figure 10C:
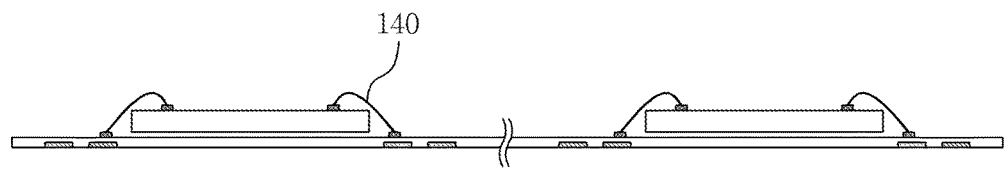

Referring to FIG. 10C, the bonding pads 135 may be electrically connected to the wire pads 145 using bonding wires 140.

Figure 10D:
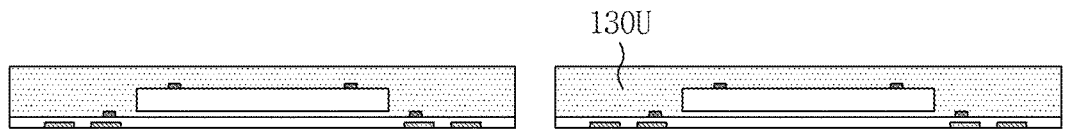

Referring to FIG. 10D, an upper molding compound 130U may be formed to cover the upper semiconductor chips 115U and separated into the upper semiconductor chips 115U. The upper molding compound 130U may comprise an epoxy resin or polyimide. The separation of the upper molding compound 130U may be performed using, for example, a sawing process or a cutting process.

Figure 10E:

Referring to FIG. 10E, the upper semiconductor package 105U may be turned upside down, and upper connectors 180 may be formed on the upper lands 155U, respectively.

Figure 10F:
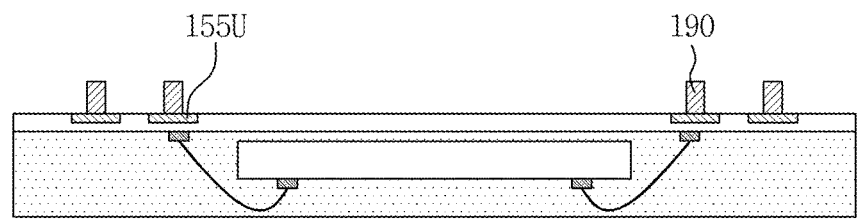

According to exemplary embodiments of the inventive concepts, referring to FIG. 10F, package bumps 190 may be formed on the upper lands 155U, respectively.

FIGS. 11A through 11I show a method of fabricating an apparatus according to embodiments of the inventive concepts.

Figure 11A:
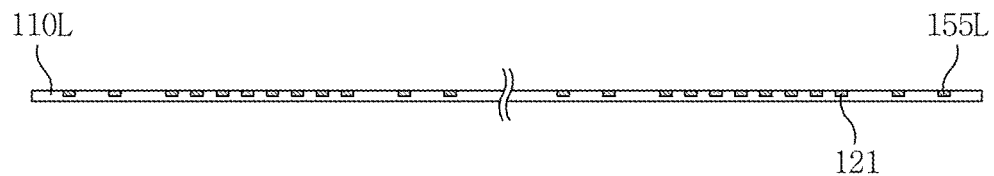
FIGS. 11A through 11L are schematic longitudinal sectional views illustrating a method of fabricating a stack structure of semiconductor packages according to the general inventive concepts.

Referring to FIG. 11A, lower lands 155L may be formed on a lower package substrate 110L. The lower lands 155L may be formed using a screen printing technique. Alternatively, the lower lands 155L may be formed using a deposition technique, a bonding technique, a plating technique, or an inkjet technique. In an embodiment, chip bump lands 121 may be formed using the same process as or a different process from the process of forming the lower lands 155L. That is, the lower lands 155L and the chip bump lands 121 may be formed on the lower package substrate 110L.

Figure 11B:
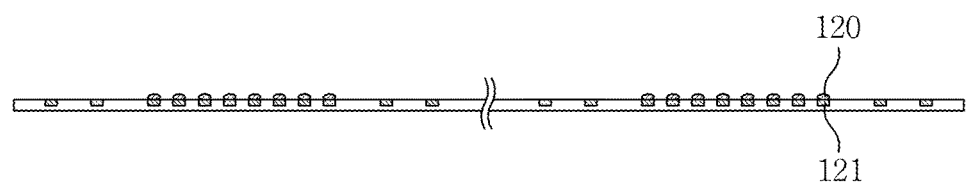

Referring to FIG. 11B, conductive chip bumps 120 may be formed on the lower package substrate 110L. The conductive chip bumps 120 may be formed using a screen printing process, an inkjet process, or a soldering process. The conductive chip bumps 120 may be electrically connected to the chip bump lands 121, respectively.

Figure 11C:
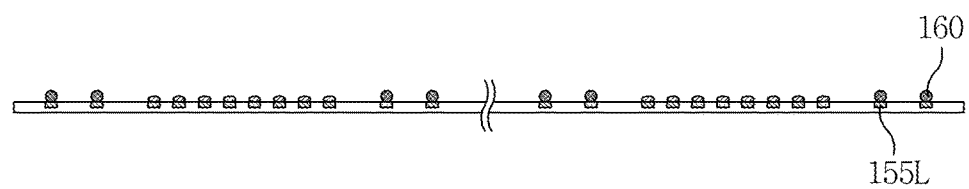

Referring to FIG. 11C, lower connectors 160 may be formed on the lower lands 155L. The lower connectors 160 may be formed using, for example, a screen printing technique, an inkjet technique, or a soldering technique. The lower connectors 160 may be formed during the formation of the conductive chip bumps 120. In other words, the conductive chip bumps 120 and the lower connectors 160 may be formed simultaneously. Although FIG. 11C illustrates that the lower connectors 160 may be formed at about the same level with the conductive chip bumps 120, the present inventive concepts is not limited thereto. The lower connectors 160 may be formed at a sufficiently higher level than the conductive chip bumps 120. When the conductive chip bumps 120 and the lower connectors 160 are at the same level, the conductive chip bumps 120 and the lower connectors 160 are formed simultaneously. Also, when the conductive chip bumps 120 and the lower connectors 160 are at different levels, the conductive chip bumps 120 and the lower connectors 160 are formed using different processes.

Figure 11D:
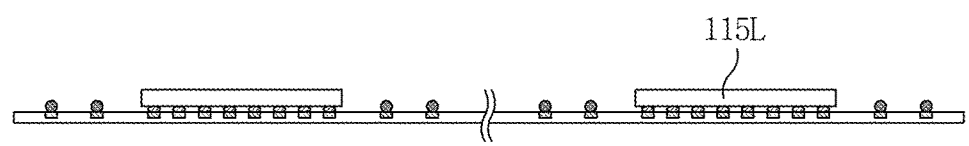

Referring to FIG. 11D, lower semiconductor chips 115L may be mounted on the conductive chip bumps 120. The lower semiconductor chips 115L may be formed as a flip chip shape and may be logic devices. The lower connectors 160 may be formed before mounting the lower semiconductor chips 115L. For example, when the lower connectors 160 are formed using a screen printing technique, the lower connectors 160 may be formed before mounting the lower semiconductor chips 115L. However, when the lower connectors 160 are formed using a soldering technique, the formation of the lower connectors 160 may be formed after mounting the lower semiconductor chips 115L.

Figure 11E:
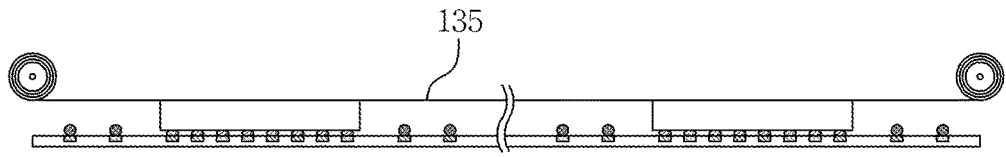

Referring to FIG. 11E, a molding control film 135 may be formed on the lower semiconductor chips 115L. The molding control film 135 may be closely adhered to top surfaces of the lower semiconductor chips 115L. A space may be ensured between the molding control film 135 and the lower package substrate 110L. A space may be ensured between the molding control film 135 and the surfaces of the lower connectors 160. The molding control film 135 may be a tape comprising, for example, cellulose, acetate, polyvinyl, or polyurethane.

Figure 11F:
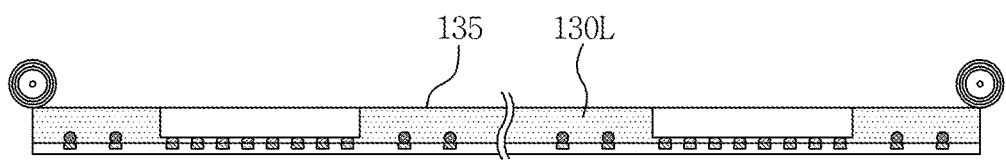

Referring to FIG. 11F, the space between the molding control film 135 and the lower package substrate 110L may be filled with a lower molding compound 130L. The lower molding compound 130L may be formed to cover the lower connectors 160, surround a lateral surface of the lower semiconductor chip 115L, and fill a lower region of the molding control film 135. The lower molding compound 130L may be formed only around the conductive chip bumps 120. In other words, the lower molding compound 130L may only fill spaces between the lower package substrate 110L and the lower semiconductor chips 115L. That is, lateral surfaces of the lower semiconductor chips 115L may be exposed to the air. In an embodiment, the lower molding compound 130L may be an insulating adhesive. Alternatively, lower lateral surfaces of the lower semiconductor chips 115L may be surrounded by the lower molding compound 130L, while upper lateral surfaces thereof may be exposed to the air. In an embodiment, the lower molding compound 130L may cover the surfaces of the lower connectors 160. In other words, the lower molding compound 130L may fill half the space between the molding control film 135 and the lower package substrate 110L.

Figure 11G:
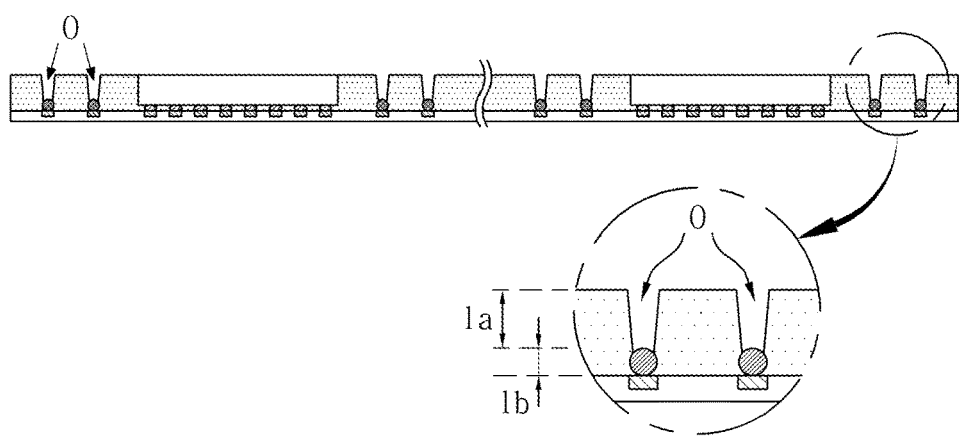

Referring to FIG. 11G, the molding control film may be removed, and a laser drilling process may be performed to expose the surface of the lower connectors 160. During the laser drilling process, the lower molding compound 130L may be selectively removed, and openings O may be formed to partially or wholly expose the surfaces of the lower connectors 160. A distance between top surfaces of the lower connectors 160 and a top surface of the molding compound 130L may be greater than a distance between the surface of the lower package substrate 110L and top surfaces of the lower connectors 160. Alternatively, spaces of the openings O may be greater than volumes of the lower connectors 160. When regarding the openings O as via holes, inner spaces of the via holes may be greater than the volumes of the lower connectors 160. In an embodiment, the spaces of the openings O or the inner spaces of the via holes may be greater than the volumes of the lower connectors 160 in terms of any one of a vertical length, a horizontal maximum width, and a maximum diameter.

Figure 11H:
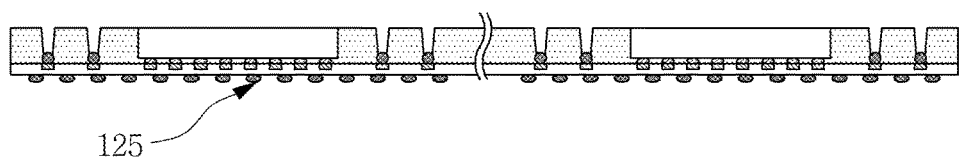

Referring to FIG. 11H, solder balls 125 may be formed on a bottom surface of the lower package substrate 110L. The solder balls 125 may be electrically connected to the conductive chip bumps 120, respectively. The solder balls 125 may be formed using a soldering process. According to embodiments of the inventive concepts, the process of forming the solder balls 125 may be performed before the laser drilling process.

Figure 11I:
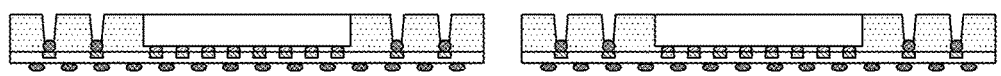

Referring to FIG. 11I, the lower package substrate 110L and the lower molding compound 130L may be separated into single lower semiconductor packages 105L. The separation process may be performed using, for example, a sawing process, a drilling process, or a cutting process.

Figure 11J:
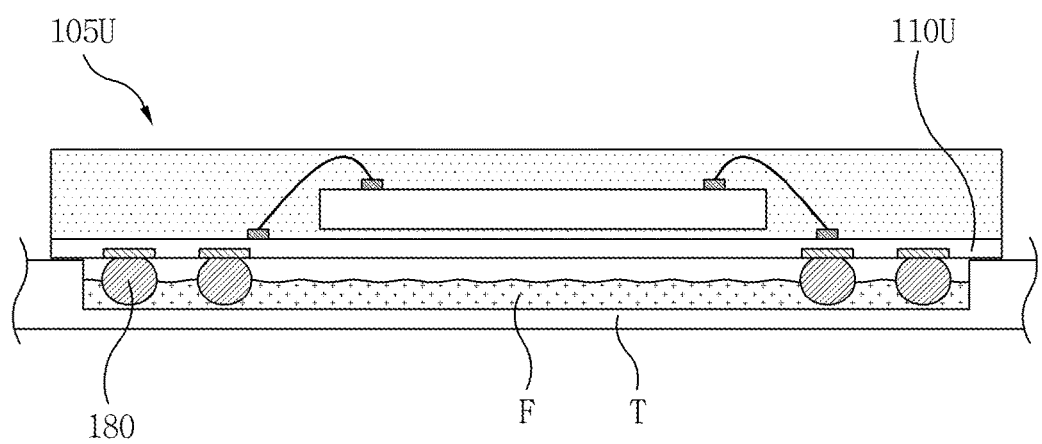

Referring to FIG. 11J, the upper connectors 180 of the upper semiconductor package 105U of FIG. 10E may be dipped in a solder flux F contained in a container T. In an embodiment, a top surface of the container T may be in contact with or close to the surface of the upper package substrate 110U. The top surface of the container T may function to determine the depth of the solder flux F in which the upper connectors 180 are dipped. In an embodiment, when the upper connectors 180 have a sufficiently large size, the upper connectors 180 may be sufficiently dipped in the solder flux F. As the size of the upper connections 180 increases, the surface areas of the upper connections 180 dipped in the solder flux F also increase. As such, physical or electrical connection between the upper connectors 180 and the lower connectors 160 can be improved. The size or surface area of the upper connector 180 may refer to a height of the upper connectors 180 formed on the surface of the upper package substrate 110U. According to an embodiment of the inventive concepts, the upper connectors 180 may be formed to a greater size or surface area than the lower connectors 160. According to an embodiment, a connection structure that is more stable in physical and electrical aspects is provided. The upper package substrate 110U may have a slightly or substantially twisted or bent shape. The upper package substrate 110U may be bent during the fabrication. When the upper connectors 180 are not formed to have a sufficiently large size, some of the upper connectors 180 may not be dipped in the solder flux F, or the surface of the upper package substrate 110U may contact the solder flux F. As such, the surface of the upper package substrate 110U can be stained. Therefore, when the upper connectors 180 are formed to have a sufficiently large size according to an embodiment of the inventive concepts, unstable factors due to the warpage of the upper package substrate 110U may be sufficiently removed.

Figure 11K:
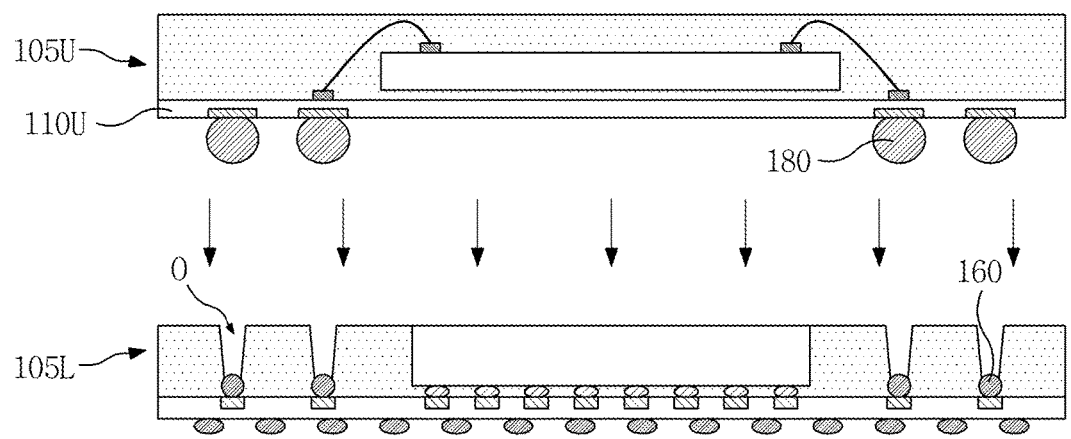

Referring to FIG. 11K, the upper semiconductor package 105U and the lower semiconductor package 105L may be stacked. The surfaces of the upper connectors 180 are sufficiently stained with the fluid F. In an embodiment, the lower connectors 160 and the upper connectors 180 may be heated and bonded to each other under pressure in the openings O and physically and electrically combined and/or connected with each other. Here, combining the lower and upper connectors 160 and 180 may be interpreted as integrally forming the lower and upper connectors 160 and 180.

Figure 11L:
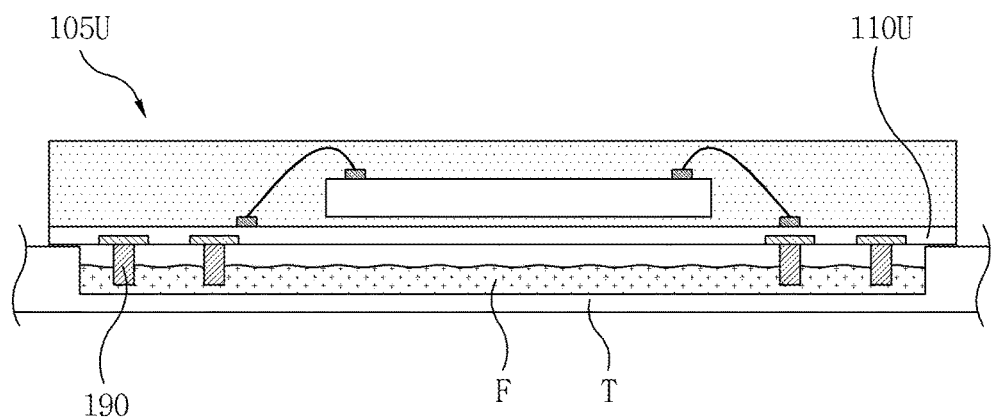

Referring to FIG. 11L, the package bumps 190 of the upper semiconductor package 105U of FIG. 10F may be dipped in the solder flux F. Subsequent processes may be understood with reference to FIG. 11K.

During the soldering process, a solder material may have a spherical shape due to surface tension. Thus, when a component is described or illustrated as a spherical or hemispherical shape, the component may be formed using a soldering process. It will be understood by those skilled in the art with reference to the above drawings and the descriptions thereof that the lower and upper connectors 160 and 180 may be formed in various shapes.

Figure 12A:
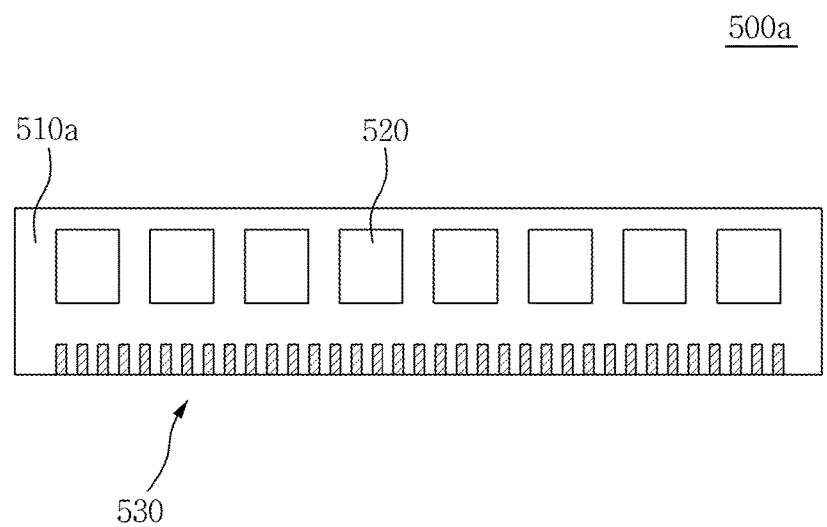
FIGS. 12A and 12B are schematic diagrams of semiconductor modules including a stack structure of semiconductor packages according to the general inventive concepts.
Figure 12B:
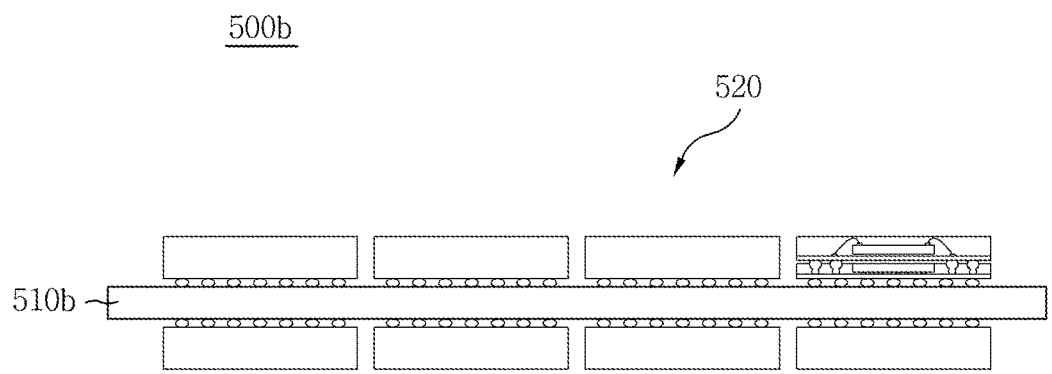

FIGS. 12A and 12B are schematic diagrams of semiconductor modules including apparatuses formed according to embodiments of the inventive concepts.

Referring to FIGS. 12A and 12B, each of semiconductor modules 500a and 500b may include a module board 510a or 510b and a plurality of semiconductor devices 520 mounted on the module board 510a or 510b. At least one of the plurality of semiconductor devices 520 may include apparatuses according to embodiments of the inventive concepts. Each of the module boards 510a and 510b may be a PCB. The semiconductor module 500a or 500b may include a plurality of contact terminals 530 formed in a lateral surface of the module board 510a or 510b. Each of the contact terminals 530 may be electrically connected to the semiconductor devices 520.

Figure 13:
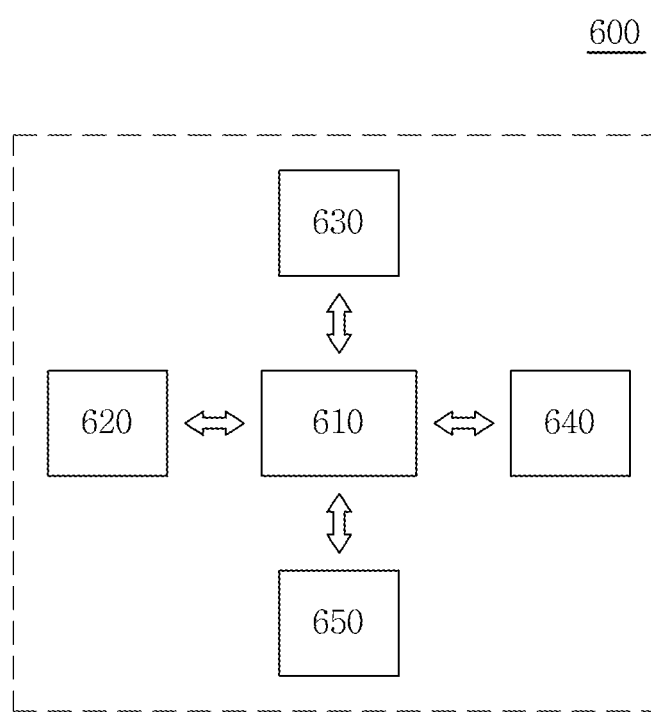
FIG. 13 is a schematic diagram of an electronic system including a stack structure of semiconductor packages according to the general inventive concepts.

FIG. 13 is a schematic diagram of an electronic system including an apparatus according to embodiments of the inventive concepts.

Referring to FIG. 13, an electronic system 600 may include a control unit 610, an input unit 620, an output unit 630, a storage unit 640, and a communication unit 650 according to an exemplary embodiment.

The control unit 610 may control the electronic system 600 and respective components at one time. The control unit 610 may be a central processing unit (CPU) or a main control unit (MCU) and include the semiconductor module 500 according to embodiments of the inventive concepts. The control unit 610 may include a stack structure of semiconductor packages according to embodiments of the inventive concepts.

The input unit 620 may transmit an electrical command signal to the control unit 610. The input unit 620 may comprise, for example, a keyboard, a keypad, a mouse, a touch pad, an image recognizer such as a scanner, or one of various input sensors. The input unit 620 may include a stack structure of semiconductor packages according to embodiments of the inventive concepts.

The output unit 630 may receive the electrical command signal from the control unit 610 and output a processing result of the electronic system 600. The output unit 630 may comprise, for example, a monitor, a printer, or a beam emitter. The output unit 630 may include a stack structure of semiconductor packages according to embodiments of the inventive concepts.

The storage unit 640 may be a component configured to temporarily or permanently store an electrical signal to be processed or already processed by the control unit 610. The storage unit 640 may be physically and electrically connected to or combined with the control unit 610. The storage unit 640 may comprise, for example, a semiconductor memory device, a magnetic storage device such as a hard disk, and optical storage device such as a compact disk, or a server having a data storage function. The storage unit 640 may include a stack structure of semiconductor packages according to embodiments of the inventive concepts.

The communication unit 650 may receive an electrical command signal from the control unit 610 and transmit or receive the electrical signal to or from another electronic system. The communication unit 650 may comprise, for example, a wired transceiving device such as a modem or a local area network (LAN) card, a wireless transceiving device such as a wireless broadband (WiBro) interface, or an infrared (IR) port. The communication unit 650 may include a stack structure of semiconductor packages according to embodiments of the inventive concepts.

The electronic system 600 according to embodiments of the inventive concepts may comprise, for example, a computer, a network server, a networking printer, a scanner, a wireless controller, a mobile communication terminal, a switching system, or any electronic device capable of programmed operations.

According to embodiments of the inventive concepts as described above, a stack structure of semiconductor packages may include inter-package connectors stably formed even when a distance between the inter-package connectors is substantially small.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method for fabricating a semiconductor package, comprising:
mounting a first semiconductor chip on a first area of a first substrate;
disposing a first connector, which is a solder ball, on a second area of the first substrate such that a top surface of the first connector is lower than a top surface of the first semiconductor chip:
placing a first molding compound on the first substrate such that the first molding compound contacts side surfaces of the first semiconductor chip and covers the first connector and the top surface of the first semiconductor chip is not covered with the first molding compound;
placing a molding control film on the first semiconductor chip, and horizontally extending the molding control film over the first substrate before placing the first molding compound such that the first molding compound does not cover the top surface of the first semiconductor chip;
detaching the molding control film after the horizontally extending;
forming an opening through the first molding compound to expose a portion of the first connector;
disposing a second connector, which is a solder ball, and a second semiconductor chip on a lower surface and a upper surface of a second substrate, respectively; and
placing the second substrate on the first substrate such that the second connector contacts the first connector at a location lower than the top surface of the first semiconductor chip.

2. The method of claim 1, the opening through the first molding compound is formed by a laser drilling process.

3. The method of claim 1, wherein the first molding compound surrounds at least a portion of the second connector.

4. The method of claim 1, wherein a plurality of conductive chip bumps are disposed between the first semiconductor chip and the first substrate such that connecting the first semiconductor chip is electrically connected with the first substrate.

5. The method of claim 1, further comprising:
placing a second molding compound to be in contact with the second semiconductor chip.

6. The method of claim 1, further comprising:
forming a wire bonding that electrically connects the second semiconductor chip with the second substrate.

7. The method of claim 1, wherein a space between the molding control film and the first substrate is filled with the first molding compound.

8. The method of claim 2, the second connector has a larger volume than that of the first connector.

9. The method of claim 2, the second connector has a larger radius than that of the first connector.

10. The method of claim 2, the first connector is configured to prevent the opening from extending into the first substrate during the laser drilling process.

11. The method of claim 4, wherein the first molding compound fills a gap between the first semiconductor chip and the first substrate.

12. The method of claim 7, wherein the molding control film includes one of cellulose, acetate, polyvinyl, or polyurethane.

13. A method for fabricating a semiconductor package, comprising:
mounting a first semiconductor chip on a first area of a first substrate;
disposing a first connector, which is a solder ball, on a second area of the first substrate such that a top surface of the first connector is lower than a top surface of the first semiconductor chip;
placing a molding control film on the first semiconductor chip, the molding control film contacting a top surface of the first semiconductor chip and horizontally extending over the first substrate;
filling a space between the molding control film and the first substrate with a first molding compound such that the first molding compound contacts side surfaces of the first semiconductor chip and covers the first connector and the top surface of the first semiconductor chip is not covered with the first molding compound;
detaching the molding control film;
forming an opening through the first molding compound to expose a portion of the first connector;
disposing a second connector, which is a solder ball, and a second semiconductor chip on opposite surfaces of a second substrate, respectively; and
placing the second substrate on the first substrate such that the second connector contacts the first connector at a location lower than the top surface of the first semiconductor chip.

14. The method of claim 13, the opening through the first molding compound is formed by a laser drilling process.

15. The method of claim 13, the second connector has a larger volume than that of the first connector.

16. The method of claim 13, the second connector has a larger radius than that of the first connector.

17. The method of claim 14, the first connector is configured to prevent the opening from extending into the first substrate during the laser drilling process.

* * * * *